(12) United States Patent
Rich et al.

(10) Patent No.: US 10,534,059 B2
(45) Date of Patent: Jan. 14, 2020

(54) BAYESIAN MODEL FOR HIGHLY ACCELERATED PHASE-CONTRAST MRI

(71) Applicants: Ohio State Innovation Foundation, Columbus, OH (US); Siemens Healthcare GmbH, Erlangen (DE)

(72) Inventors: Adam Rich, Columbus, OH (US); Lee C. Potter, Riverlea, OH (US); Ning Jin, Powell, OH (US); Joshua Ash, Fairborn, OH (US); Orlando P. Simonetti, Columbus, OH (US); Rizwan Ahmad, Columbus, OH (US)

(73) Assignees: OHIO STATE INNOVATION FOUNDATION, Columbus, OH (US); SIEMENS MEDICAL SOLUTIONS USA, INC., Malver, PA (US)

(*) Notice: Subject to any disclaimer, the term of this patent is extended or adjusted under 35 U.S.C. 154(b) by 132 days.

(21) Appl. No.: 15/160,083

(22) Filed: May 20, 2016

(65) Prior Publication Data

US 2016/0341810 A1 Nov. 24, 2016

Related U.S. Application Data

(60) Provisional application No. 62/164,521, filed on May 20, 2015.

(51) Int. Cl.
| | |
|---|---|
| *G01R 33/563* | (2006.01) |
| *G06F 17/50* | (2006.01) |
| *G06T 7/00* | (2017.01) |
| *G06T 11/00* | (2006.01) |
| *G01R 33/56* | (2006.01) |
| *G01R 33/561* | (2006.01) |

(52) U.S. Cl.
CPC ... *G01R 33/56316* (2013.01); *G01R 33/5608* (2013.01); *G06F 17/50* (2013.01); *G06T 7/0012* (2013.01); *G06T 11/003* (2013.01); *G01R 33/5611* (2013.01); *G06T 2207/10088* (2013.01); *G06T 2207/30048* (2013.01); *G06T 2207/30101* (2013.01)

(58) Field of Classification Search
CPC .................................................... G01R 33/56
USPC ....................................................... 324/309
See application file for complete search history.

(56) References Cited

U.S. PATENT DOCUMENTS

| | | | | |
|---|---|---|---|---|
| 6,496,184 B1* | 12/2002 | Freeman | ............ | G06K 9/00624 345/419 |
| 2011/0044524 A1* | 2/2011 | Wang | .................... | G01R 33/54 382/131 |

(Continued)

OTHER PUBLICATIONS

Binter et al., Bayesian Multipoint Velocity Encoding for Concurrent Flow and Turbulence Mapping, 2013.*

(Continued)

*Primary Examiner* — Douglas X Rodriguez
(74) *Attorney, Agent, or Firm* — Meunier Carlin & Curfman LLC

(57) ABSTRACT

Methods and systems for accelerated Phase-contrast magnetic resonance imaging (PC-MRI). The technique is based on Bayesian inference and provides for fast computation via an approximate message passing algorithm. The Bayesian formulation allows modeling and exploitation of the statistical relationships across space, time, and encodings in order to achieve reproducible estimation of flow from highly undersampled data.

20 Claims, 21 Drawing Sheets

(56) References Cited

U.S. PATENT DOCUMENTS

2011/0241677 A1* 10/2011 Busse ............. G01R 33/56308
   324/309
2015/0346303 A1* 12/2015 Hu .................... G01R 33/5601
   600/420

OTHER PUBLICATIONS

Ahmad, et al., "Parameter-Free Sparsity Adaptive Compressive Recovery (SCoRe)", ISMRM 23rd Annual Meeting, 2015; program ID: 3414. abstract.

Ahmad, et al., "Variable density incoherent spatiotemporal acquisition (VISTA) for highly accelerated cardiac MRI", Magn Reson Med 74:5, 2014, 1266-1278.

Aletras, "DENSE: displacement encoding with stimulated echoes in cardiac functional MRI", J Magn Reson 137, 1999, 247-252.

Ash, et al., "A unifying perspective of coherent and non-coherent change detection", Proc SPIE, Algorithms Synth Aperture Radar Imag XXI, 2014, 909309, 9 pages.

Ash, et a., "Joint imaging and change detection for robust exploitation in interrupted SAR environments", Proc. SPIE, Algorithms Synth Aperture Radar Imag XX, 2013, 9 pages.

Basha, et al., "Accelerated three-dimensional cine phase contrast imaging using randomly undersampled echo planar imaging with compressed sensing reconstruction", NMR in Biomedicine 28:1, 2015, 30-39.

Bernstein, et al., "Reconstructions of Phase Contrast, Phased Array Multicoil Data", MRM 32, 1994, 330-334.

Borgerding, et al., "Generalized approximate message passing for the cosparse analysis model", IEEE Int Conf on Acoust, Speech, and Signal Process, 2015, 8 pages.

Brix, et al., "Three dimensional three component whole heart cardiovascular magnetic resonance velocity mapping: comparison of flow measurements from 3D and 2D acquisitions", J Cardiovasc Magn Reson 11, 2009, 1-7.

Buehrer, et al., "Array compression for MRI with large coil arrays", Magn Reson Med 57, 2007, 1131-1139.

Debl, et al., "Quantification of left-to-right shunting in adult congenital heart disease: phase-contrast cine MRI compared with invasive oximetry.", Br J Radio! 82:977, 2009, 386-391.

Dempster, et al., "Maximum-likelihood from incomplete data via the EM algorithm", J Royal Stat Soc 39, 1977, 38 pages.

Donoho, et al., "Message-passing algorithms for compressed sensing", Proc Natl Acad of Sci 106, 2009, 18914-18919.

Giese, et al., "Highly undersampled phase-contrast flow measurements using compartment-based k-t principal component analysis", Magn Reson Med 69, 2013, 434-443.

Griswold, et al., "Generalized autocalibrating partially parallel acquisitions (GRAPPA)", Magn Reson Med 47, 2002, 1202-1210.

Harloff, et al., "In vivo assessment of wall shear stress in the atherosclerotic aorta using flow-sensitive 4D MRI.", Magn Reson Med 63(6), 2010, 1529-1536.

Johnson, et al., "Improved 3D phase contrast MRI with off-resonance corrected dual echo VIPR", Magn Reson Med 68, 2008, 1329-1336.

Kieran, et al., "MRI phase contrast velocity and flow errors in turbulent stenotic jets", J of Magn Reson Imaging 28, 2008, 210-218.

Kim, et al., "Accelerated phase-contrast cine MRI using k-t SPARSE-SENSE", Magn Reson Med 67, 2012, 1054-1064.

Knobloch, et al., "Sparsity transform k-t principal component analysis for accelerating cine three-dimensional flow measurements", Magn Reson Med 70, 2013, 53-63.

Kondo, et al., "Right and left ventricular stroke volume measurements with velocity-encoded cine MR imaging: in vitro and in vivo validation", Am J of Roentgenology 157:1, 1991, 9-16.

Kschischang, , "Factor graphs and the sum-product algorithm", IEEE Trans Inf Theory 47, 2001, 498-519.

Kwak, et al., "Accelerated aortic flow assessment with compressed sensing with and without use of the sparsity of the complex difference image", Magn Reson Med 70, 2013, 851-858.

Lin, et al., "Shared velocity encoding: a method to improve the temporal resolution of phase-contrast velocity measurements", Magn Reson Med 68:3, 2012, 703-710.

Loeliger, et al., "An introduction to factor graphs", IEEE Signal Process Magazine 21, 2004, 28-41.

Loeliger, et al., "The factor graph approach to model-based signal processing", Proc of the IEEE 95:6, 2007, 1295-1322.

Mahjoub, et al., "Tutorial and selected approaches on parameter learning in Bayesian network with incomplete data", Adv Neural Netw 7367, 2012, 478-488.

Markl, et al.,"4D Flow MRI", J Magn Reson Imaging 36, 2012, 1015-1036.

Markl, et al., "Comprehensive 4D velocity mapping of the heart and great vessels by cardiovascular magnetic resonance", J Cardiovasc Magn Reson 13, 2011, 1-22.

PELC, "Phase contrast cine magnetic resonance imaging", Magn Reson Q 7:4, 1991, 229-254.

Rangan, "Generalized approximate message passing for estimation with random linear mixing", IEEE Int Symp Inf Theory Proc, 2011, 5 pages.

Schniter, et al., "Compressive phase retrieval via generalized approximate message passing", IEEE Trans Signal Process 63:4, 2015, 1043-1055.

Sigfridsson, et al., "Four-dimensional flow MRI using spiral acquisition", Magn Reson Med 68, 2012, 1065-1073.

Som, et al., "Compressive imaging using approximate message passing and a Markov-tree prior", IEEE Trans Signal Process 60:7, 2012, 3439-3448.

Tariq, et al., "Venous and arterial flow quantification are equally accurate and precise with parallel imaging compressed sensing 4D phase contrast MRI", J Magn Reson Imaging 37:6, 2013, 1419-26.

Thunberg, et al., "Accuracy and reproducibility in phase contrast imaging using SENSE", Magn Reson Med 50, 2003, 1061-1068.

Uren, et al., "Relation between myocardial blood flow and the severity of coronary-artery stenosis", New Eng J Med 330, 1994, 1782-1788.

Vila, et al., "Expectation-maximization Gaussian-mixture approximate message passing", IEEE Trans Signal Process 61, 2013, 4658-4672.

Walsh, et al., "Adaptive reconstruction of phased array MR imagery", Magn Reson Med 43, 2000, 682-690.

Ziniel, et al., "Dynamic compressive sensing of time-varying signals via approximate message passing", IEEE Trans Signal Process 61, 2013, 32 pages.

* cited by examiner

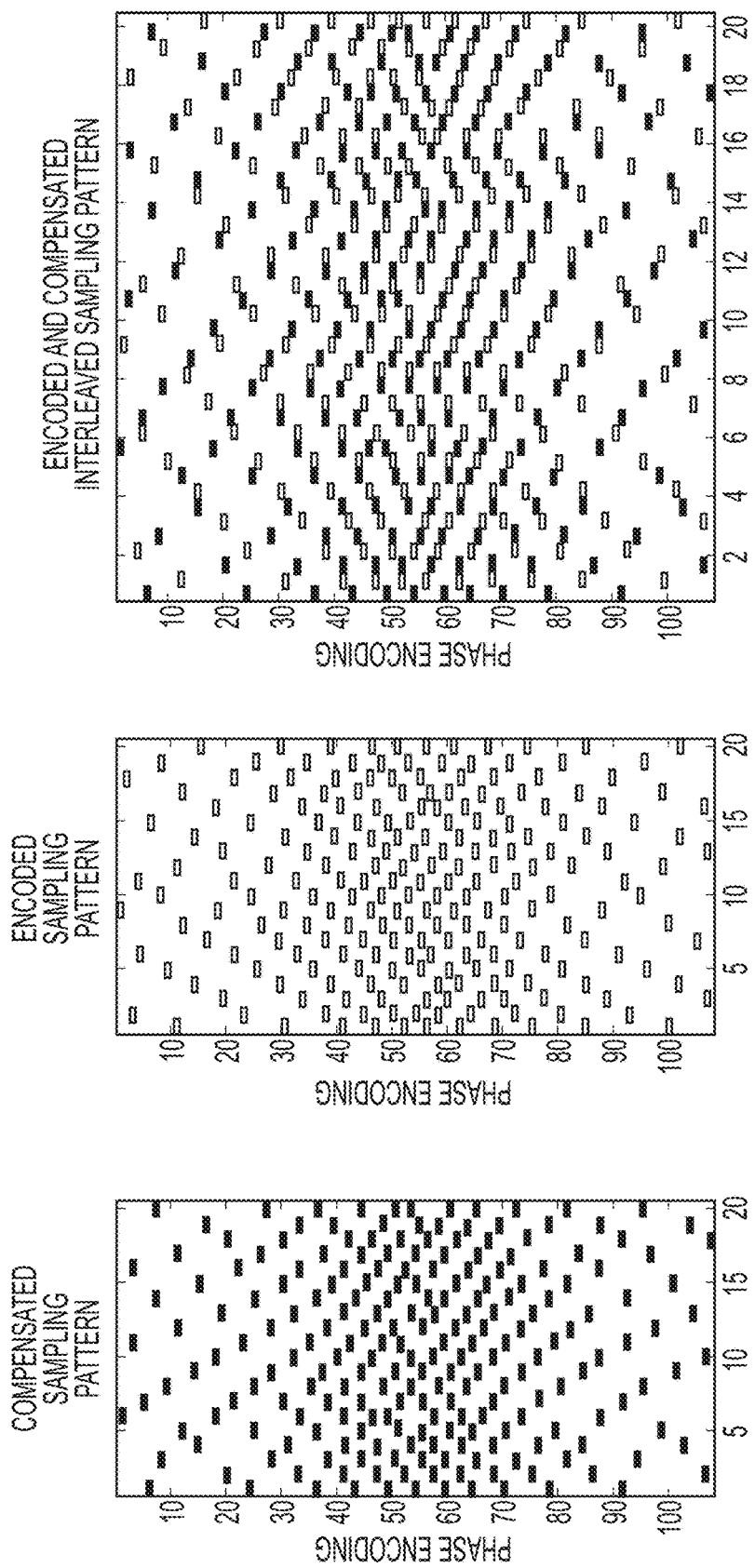

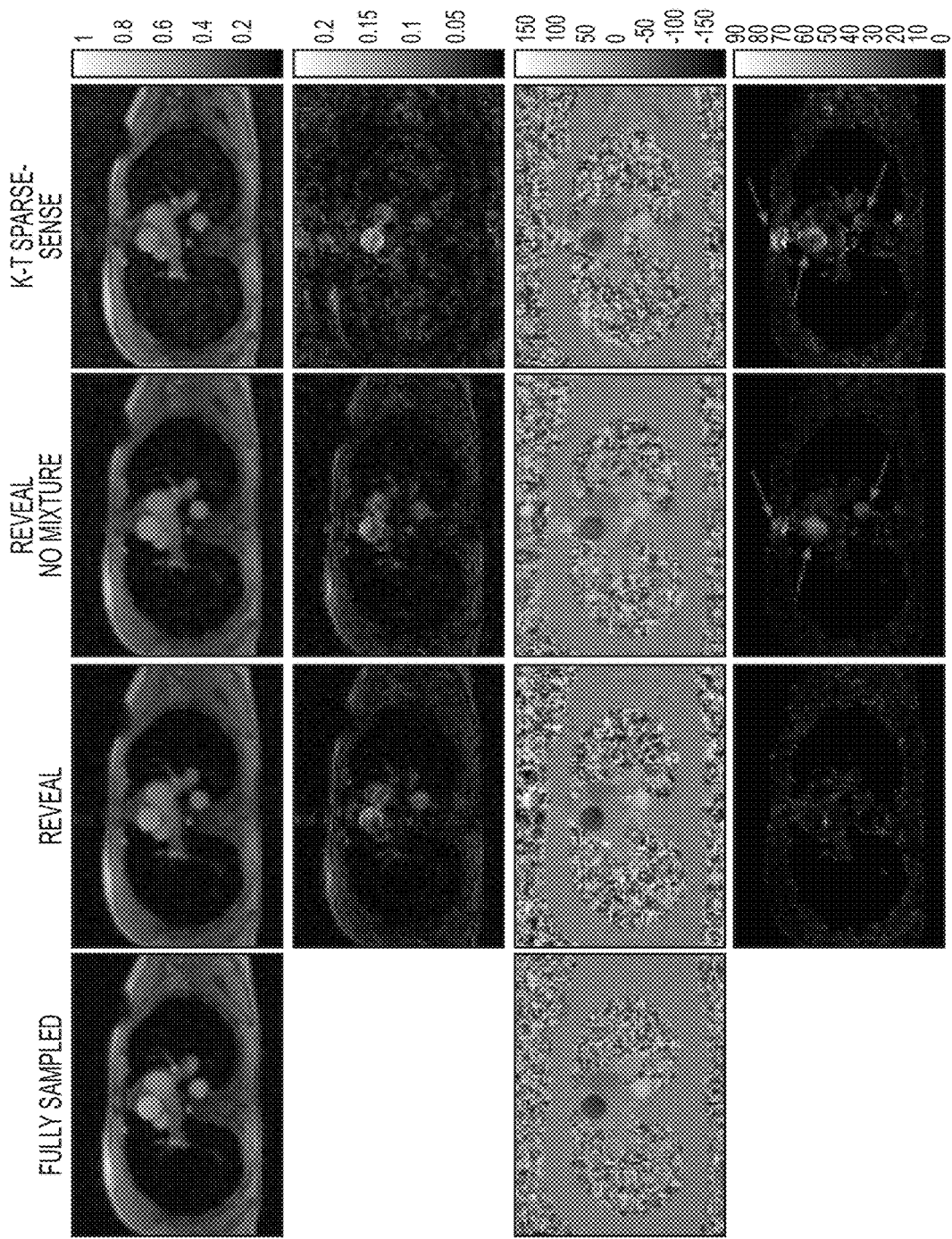

BAYESIAN MODEL FOR HIGHLY ACCELERATED PHASE-CONTRAST MRI

CROSS-REFERENCE TO RELATED APPLICATION

This application claims priority to U.S. Provisional Patent Application No. 62/164,521, filed May 20, 2015, entitled "A BAYESIAN MODEL FOR HIGHLY ACCELERATED PHASE-CONTRAST MRI," which is incorporated herein by reference in its entirety.

STATEMENT OF GOVERNMENT SUPPORT

This invention was made with government support under R01 HL102450 awarded by the National Institutes of Health and N66001-11-1-4090 awarded by the Space & Naval Warfare Systems Center. The government has certain rights in the invention.

BACKGROUND

Phase-contrast magnetic resonance imaging (PC-MRI) is a noninvasive technique capable of quantifying hemodynamics in the heart and great vessels. Because spin moving through a spatially varying magnetic field accumulates phase compared to static spin, velocity information in PC-MRI is encoded into the phase of the complex-valued image. This information is then retrieved by measuring the phase differences between images collected under different values of the velocity-encoding gradients. Cardiovascular applications of PC-MRI include quantification of cardiac function, evaluation of stenosis, assessment of congenital heart disease, and evaluation of aortic atherosclerosis.

Clinical application of PC-MRI to 4D flow imaging and to real-time through-plane velocity imaging has been precluded by long scan times and low acquisition efficiency. Several methodological improvements have been proposed to reduce acquisition time of flow imaging via PC-MRI: parallel MRI (pMRI), fast sampling strategies, and iterative image recovery inspired by compressive sensing (CS) concepts. For 2D PC-MRI, Kim et al. proposed k-t SPARSE-SENSE and reported a six-fold acceleration for liver imaging with electrocardiogram triggering; k-t SPARSE-SENSE combines randomized Cartesian sampling, pMRI, and sparsity of temporal principal components analysis (PCA). More recently, Giese et al. individually processed principal components from multiple spatial compartments in the image series to capture the spatially varying dynamic behavior. Kwak et al. recovered five-fold accelerated 2D PC-MRI by enforcing total variation (TV) minimization of both encoded and compensated images as well as exploiting the sparsity of the complex difference image. Most 2D PC-MRI reconstruction methods can be extended for 4D flow where even higher acceleration is possible due to additional redundancy. Knobloch et al. proposed a method that utilizes both temporal PCA and the complex difference of velocity-encoded and velocity-compensated images to report an eight-fold acceleration for 4D flow. Despite these proposed processing methods, the challenge remains to achieve 4D flow imaging in clinically relevant acquisition times.

SUMMARY

The present disclosure is directed to a novel technique for accelerated Phase-contrast magnetic resonance imaging (PC-MRI). The technique is based on Bayesian inference yet admits fast computation via an approximate message passing algorithm. The Bayesian formulation allows modeling and exploitation of the statistical relationships across space, time, and encodings in order to achieve reproducible estimation of flow from highly undersampled data.

Several characteristics are disclosed in accordance with the present disclosure. First, data are jointly processed across all coils, frames, and encodings. Second, overcomplete (non-decimated) wavelets are employed for transform-based compression jointly across both space and time. Third, an optimized sampling strategy provides a distinct variable density sampling pattern for each encoding; the sampling also facilitates estimation of coil sensitivity maps. Fourth, a mixture density model is employed to capture the strong redundancy between the background and velocity-encoded images; the approach captures not only the similarity in magnitudes between background and velocity-encoded images but also the phase similarity in velocity-free regions. From the mixture density, the algorithm implicitly learns a probabilistic segmentation of image frames into velocity-containing and velocity-free regions. Fifth, approximate message passing provides a fast computational framework to enable minimum mean squared error (MMSE) estimation while jointly processing the large corpus of spatiotemporal data. Sixth, an expectation-maximization procedure within the empirical Bayes framework provides automatic parameter tuning. Together, these characteristics yield a principled estimation approach that enables accelerated PC-MRI.

To describe the above, herein the term "ReVEAL" is used, which means "Reconstructing Velocity Encoded MRI with Approximate Message passing aLgorithms." For time-resolved, planar imaging with one velocity encoded direction (through-plane), it is demonstrated that prospectively undersampled acquisition achieving an acceleration factor of 10 using both phantom and in vivo data. The techniques of the present disclosure will yield higher acceleration with the increased number of correlated encodings present in 4D flow imaging.

Thus, in accordance with present disclosure, there is described a method of image acquisition and reconstruction in a magnetic resonance imaging (MRI) apparatus. The method includes acquiring undersampled phase-contrast magnetic resonance imaging (PC-MRI) data using Variable density incoherent spatiotemporal acquisition (VISTA) sampling; modeling the PC-MRI data in accordance with statistical relationships across space, time and encodings; performing an image reconstruction from modeled PC-MRI data; and displaying reconstructed images.

In accordance with additional aspects of the disclosure, a magnetic resonance imaging (MRI) system is described. The system includes an MRI machine that acquires undersampled phase-contrast magnetic resonance imaging (PC-MRI) data using Variable density incoherent spatiotemporal acquisition (VISTA) sampling generates MRI image data. The system also includes a computing device that receives the PC-MRI data and models the PC-MRI data in accordance with statistical relationships across space, time and encodings, the computing device further performing an image reconstruction from modeled PC-MRI data. A display that receives and displays reconstructed images.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIGS. 1A-1C illustrate a representative set of Variable density incoherent spatiotemporal acquisition (VISTA) sampling patterns for Reconstructing Velocity Encoded MRI (ReVEAL) in accordance with the present disclosure;

FIG. 7 illustrates prospectively accelerated in vivo data reconstructed at R=12;

DETAILED DESCRIPTION

Figures 2A, 2B:
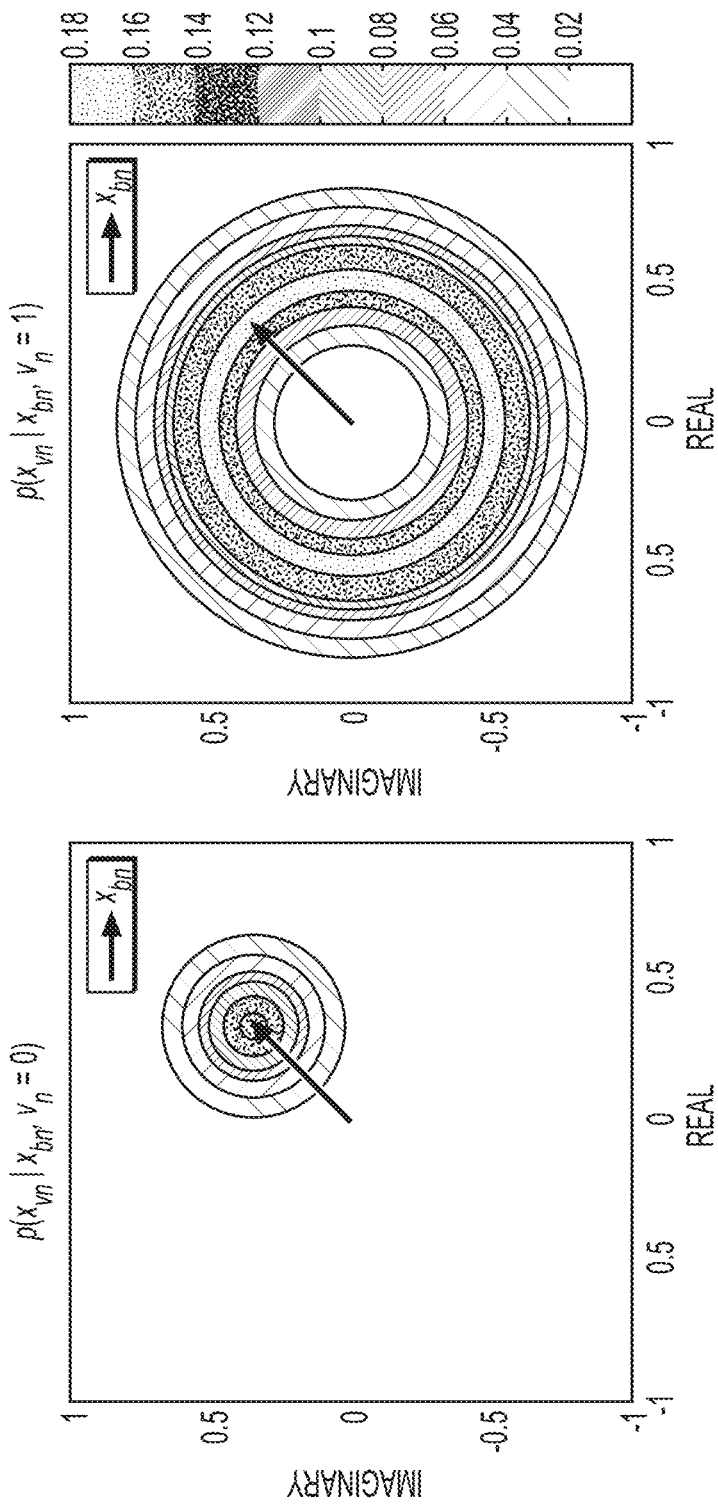
FIGS. 2A-2B illustrate the conditional prior distributions used by ReVEAL.

Theory
Parallel MRI Signal Model

The received signal model for 2D dynamic MRI with multiple receiver coils will now be described. The measured data $y_i^t$ from the $i^{th}$ coil at time index, or frame, t can be represented by the relationship:

$$y_i^t = D^t F S_i^t x^t + \phi_i^t \qquad (1)$$

where $D^t$ is a k-space sample selection operator at time t, F is the 2D Fourier operator, and $S_i^t$ is a diagonal matrix which represents the $i^{th}$ coil sensitivity map. Here, $x^t \in \mathbb{C}^N$ is a vectorization of the two-dimensional image to be recovered, $y_i^t \in \mathbb{C}^M$ is the subsampled Fourier measurements, and $\phi_i^t \in \mathbb{C}^N$ is additive noise. Relationship (1) can be rewritten in block notation for C coils as follows:

$$\underbrace{\begin{bmatrix} y_1^t \\ y_2^t \\ \vdots \\ y_C^t \end{bmatrix}}_{y^t} = \underbrace{\begin{bmatrix} D^t F S_1^t \\ D^t F S_2^t \\ \vdots \\ D^t F S_C^t \end{bmatrix}}_{A^t} x^t + \underbrace{\begin{bmatrix} \phi_1^t \\ \phi_2^t \\ \vdots \\ \phi_C^t \end{bmatrix}}_{\phi^t}. \qquad (2)$$

The 2D signal model given in (2) can be viewed as a single time instance in a dynamic image sequence. The signal model for the dynamic sequence of P frames is given by $$\underbrace{\begin{bmatrix} y^1 \\ y^2 \\ \vdots \\ y^P \end{bmatrix}}_{y^t} = \underbrace{\begin{bmatrix} A^1 & 0 & \cdots & 0 \\ 0 & A^2 & \cdots & 0 \\ \vdots & \vdots & \ddots & \vdots \\ 0 & 0 & \cdots & A^P \end{bmatrix}}_{A} \underbrace{\begin{bmatrix} x^1 \\ x^2 \\ \vdots \\ x^P \end{bmatrix}}_{x} + \underbrace{\begin{bmatrix} \phi^1 \\ \phi^2 \\ \vdots \\ \phi^P \end{bmatrix}}_{\phi}, \qquad (3)$$

where $A^t$ represents the measurement matrix at time t with possibly time-dependent downsampling and coil sensitivities $D^t$ and $S_i^t$, respectively. Relationship (3) can be written as $y = Ax + \phi$.

For the k-space sampling pattern described by $D^t$, i=1, ..., P variable density incoherent sampling patterns can be used. The design results in sampling patterns that differ across frames as well as across the velocity encodings. The sampling design optimizes a constrained energy potential to produce a pseudo-random pattern that promotes incoherence of the operator A, limits eddy currents, and provides a fully sampled k-space when time-averaged across all frames. The last of these constraints facilitates estimation of coil sensitivities without calibration data.

A representative VISTA sampling pattern for PC-MRI is shown in FIGS. 1A-1C. In particular, FIGS. 1A-1C illustrate a representative set of VISTA sampling patterns for ReVEAL at an acceleration rate of R=10 with 108 phase encode lines and 20 frames. FIG. 1A shows the VISTA sampling pattern for the compensated data. FIG. 1B illustrates the VISTA sampling pattern for the encoded measurements. FIG. 1C shows the interleaved encoded and compensated sampling patterns, where the sampling patterns are incoherent across encodings.

Bayesian Representation of Data Dependencies

In phase-contrast imaging, velocity is encoded into the phase of the complex-valued MR images. Due to off-resonance effects and magnetic field inhomogeneities, the MR images have phase, referred to here as background phase, which does not contain velocity information. To compensate for background phase, two measurements are made. The first, denoted by $y_b$, is the velocity-compensated measurement. The corresponding image $x_b = me^{j\theta_b}$ only contains the background phase, $\theta_b$; the multiplication and exponentiation are to be interpreted pixel-wise. The second, denoted by $y_v$, is the velocity-encoded measurement. The corresponding image $x_v = me^{j(\theta_b + \theta_v)}$ contains both the background phase, $\theta_b$, and the velocity-encoded phase, $\theta_v$. The relationship between the two images is assumed to be $$x_v = me^{j(\theta_b + \theta_v)} = x_b e^{j\theta_v}. \qquad (4)$$

The signals $x_b$ and $x_v$ are measured under the model in (3), which may be denoted as:

$$y_b = A_b x_b + \phi_b \qquad (5)$$

$$y_v = A_v x_v + \phi_v, \qquad (6)$$

where $\phi_b$ and $\phi_v$ are additive measurement noise. The measurement matrices, $A_b$ and $A_v$, may differ, thereby allowing for different sampling patterns for each of the two measurements.

To capture the physical behavior suggested in (3), $x_b$, $x_v$, and $\theta_v$ may be modeled as random variables. The phase difference $\theta_v$ explicitly appears in the model as a parameter to be inferred from the noisy data. In addition, a "hidden" Bernoulli random variable may be introduced, denoted as v, to indicate the inferred locations in $x_v$ that contain non-zero velocity. By application of Bayes' theorem and the chain rule for conditional probability densities, the posterior distribution on these unknown variables, given the observed noisy measurements, can be written as the following relationship:

$$p(x_b, x_v, \theta_v, v | y_b, y_v) \propto \qquad (7)$$

$$p(x_b) \prod_{m=1}^{M} p(y_{bm}|x_b) p(y_{vm}|x_v) \times \prod_{n=1}^{N} p(x_{vn}|x_{bn}, \theta_{vn}, v_n) p(\theta_{vn}) p(v_n).$$

In relationship (7), $\propto$ denotes proportionality; the double subscripts $y_{bm}$ and $x_{bn}$ denote the $m^{th}$ measurement sample and $n^{th}$ image pixel, respectively, for the background encoding. Further, N and M denote the total number of pixels and measurements, respectively. Three independence assumptions are invoked. The model in (7) assumes that $\theta_v$ and $x_b$ are independent, i.e. $p(\theta_v|x_b)=p(\theta_v)$. Likewise, it is assumed that v is independent of both $\theta_v$ and $x_b$, i.e. $p(v|x_b, \theta_v)=p(v)$. A third independence assumption, $p(\theta_v|v)=p(\theta_v)$ is chosen for convenience, similar to indicator variable modeling. These independence assumptions are used herein to bypass potential regularizing structure in favor of modeling and computational simplicity; more prominent signal structure is exploited in the remaining factors discussed below.

A mixture density to capture the redundancy between a velocity-encoded pixel, $x_{vn}$, and the corresponding velocity-compensated (background) pixel, $x_{bn}$, may be adopted in view of relationship (4). The conditional distribution is given by the following:

$$p(x_{vn}|x_{bn},\theta_{vn},v_n)=(1-v_n)CN(x_{vn};x_{bn},\sigma^2)+ \\ v_n CN(x_{vn};x_{bn}e^{j\theta_{vn}},\sigma^2) \qquad (8)$$

The notation $CN(x; \mu, \sigma^2)$ denotes a circularly symmetric complex-valued Gaussian density on x with mean $\mu$ and variance $\sigma^2$. The distribution is conditioned on the hidden indicator variable, $v_n$, which serves as probabilistic segmentation of the image into velocity-containing and velocity-free regions, with $v_n=1$ denoting velocity at pixel n. The first term of (8), $(1-v_n)CN(x_{vn};x_{bn},\sigma^2)$, represents the relationship between $x_v$ and $x_b$ for zero-velocity regions. This term models $x_{vn}$ as a Gaussian perturbed version of $x_{bn}$. The variance, $\sigma^2$, serves to model physical departures of noiseless images from the idealized assumption in relationship (4). In contrast, the effects of measurement noise are modeled by the likelihood function given below.

FIGS. 2A-2B illustrate the conditional prior distributions used by ReVEAL. The conditional distribution of $x_{vn}$ given both $x_{bn}$ and $v_n=0$ is depicted in FIG. 2A, where the black arrow denotes the complex-value $x_{bn}$. FIG. 2A illustrates the conditional distribution for a velocity-encoded, complex-valued pixel for velocity-free regions. In this case, the magnitude and phase are constrained. The second term of relationship (8), $v_n CN(x_{vn}; x_{bn} e^{j\theta_{vn}}, \theta^2)$, describes the relationship for regions that contain velocity-encoded phase.

The non-Gaussian conditional distribution of $x_{vn}$ given $x_{bn}$ and $v_n=1$ (i.e., velocity-containing pixels) is depicted in FIG. 2B, where the phase is non-informative and the magnitude is Rician centered at $|x_{bn}|$. FIG. 2B illustrates a conditional distribution for a velocity-encoded, complex-valued pixel given the corresponding compensated pixel for velocity-containing regions. In FIG. 2B, only the magnitude is constrained. The functional form of this conditional distribution is, as follows:

$$p(x_{vn}|x_{bn},v_n=1) = \frac{1}{2\pi}\int_0^{2\pi} CN(x_{vn}; x_{bn}e^{j\theta}, \sigma^2)d\theta_{vn} \qquad (9)$$

$$= \frac{|x_{vn}|}{\pi\sigma^2}\exp\left(-\frac{|x_{vn}|^2 + |x_{bn}|^2}{\sigma^2}\right)I_0\left(\frac{2|x_{vn}||x_{bn}|}{\sigma^2}\right),$$

where $I_0(x)$ denotes a zeroth-ordered Bessel function of the first kind.

Additional modeling choices remain in (7). First, it is assumed that the k-space measurements $y_b$ and $y_v$ are corrupted by additive, circularly symmetric complex Gaussian noise. This yields the likelihood models:

$$p(y_{bn}|x_b)=CN(y_{bn};[A_b x_b]_n,\omega^2) \qquad (10)$$

$$p(y_{bn}|x_v)=CN(y_{vn};[A_v x_v]_n,\omega^2), \qquad (11)$$

where $\omega^2$ is the noise variance, and the mean, $[Ax]_n$, is the $n^{th}$ element of the matrix vector product Ax. Second, for the prior on the phase, $p(\theta_{vn})$, the non-informative prior of equal probability on the interval $[0,2\pi)$ may be adopted. Third, a hidden variable $v \in \{0,1\}^N$ may be defined as a Bernoulli indicator with $p(v_n=1)=\gamma$. Thus, $\gamma$ is the prior probability that any pixel contains non-zero velocity, and $1-\gamma$ is the prior probability that a pixel contains no velocity.

Finally, the prior $p(x_b)$ may be addressed. It may be observed that a three-dimensional non-decimated wavelet transform, $\Psi$, applied to $x_b$ and $x_v$ across both space and time results in few non-negligible coefficients. Rather than postulate a prior density to model this behavior, augmenting the likelihood may be selected. To this end, $\tilde{M}$-by-N matrices $\tilde{A}_b$ and $\tilde{A}_v$ are formed, appending $\Psi$ as additional rows to the matrices $A_b$ and $A_v$. Then, a zero-mean Laplace likelihood for $p([\Psi x_b]_m|x_b)$ and $p([\Psi x_v]_m|x_v)$ may be adopted. The Laplace density for a complex-valued random variable x and scaling parameter $\lambda$ is:

$$p(x) = \frac{1}{2\pi\lambda^2}\exp\left\{\frac{-|x|}{\lambda}\right\}. \qquad (12)$$

The Laplace prior in Eq. (12) can be related to the $l_1$ norm by the maximum a posteriori (MAP) estimate. The MAP solution maximizes the posterior distribution. To see the relation, observe that the maximum of the log posterior under Gaussian likelihood and Laplace prior given as:

$$x_{MAP} = \underset{x}{\operatorname{argmax}} P(x|y) = \underset{x}{\operatorname{argmax}} P(y|x)P(x), \qquad (13)$$

$$= \underset{x}{\operatorname{argmax}} \log(P(x|y)) + \log(P(x)), \qquad (14)$$

$$= \underset{x}{\operatorname{argmax}} \frac{1}{\sigma^2}\|y - Ax\|_2^2 + \frac{1}{\lambda}\|x\|_1. \qquad (15)$$

However, the MMSE estimate may be approximated, given by the mean of the posterior distribution, via sum-product message passing. The cost function for MMSE minimization, within an approximate message passing algorithm, is described by the Bethe Free Energy.

Approximate Message Passing

Figure 3:
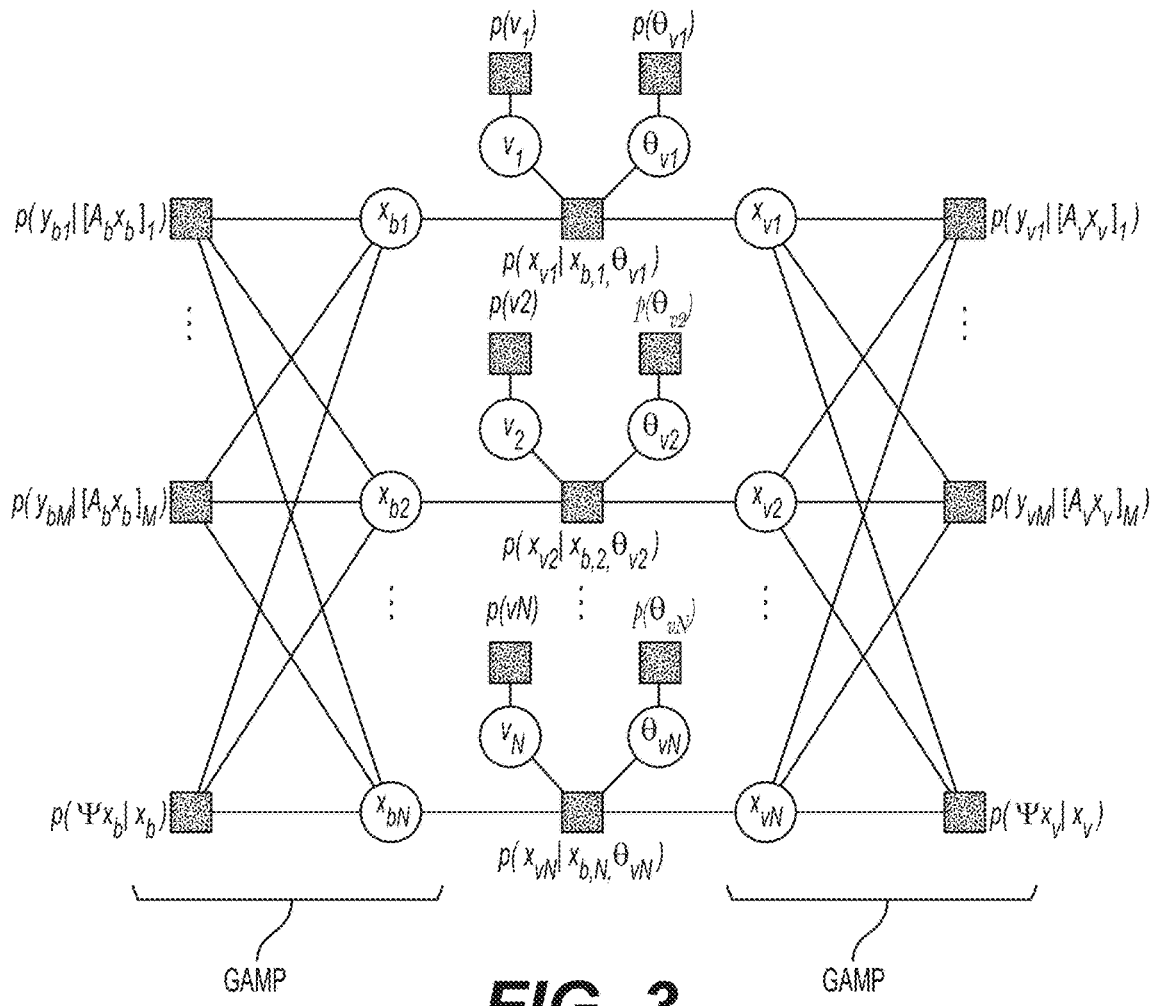
FIG. 3 illustrates a factor graph representation of the joint posterior of Phase-contrast magnetic resonance imaging (PC-MRI) data.

FIG. 3 illustrates the factor graph representation of the joint posterior of PC-MRI data for the proposed model. Message passing on the graph, also known as belief propagation, is a metaphor for an iterative algorithm. By applying the sum product rule, the update rules for the algorithm can be derived. Computation on the left and right loopy portions are accelerated via generalized approximate message passing (GAMP). The center potion of the graph is updated using standard belief propagation. The data model in (7) can be visualized as a factor graph. Factors and random variables are represented by nodes in the graph, with squares denoting factors and circles denoting variables. Edges on the graph represent the dependence of a given factor on a variable. The factor graph of the posterior distribution for the proposed model is given in FIG. 3. By expressing the posterior probability distribution of (7) as a factor graph, the sum-product algorithm can be applied to compute approximate marginal posterior distributions of $x_b$, $x_v$, $\theta_v$, and $v$ through the use of message passing techniques. From the marginal posterior distribution of a variable, the mean value provides the MMSE estimate. As depicted in FIG. 3, messages are passed along edges in the graph and convey nodes' "beliefs" about the states of their neighboring variable nodes.

On the dense, loopy portion of the graph, the message passing computation can be greatly simplified by adopting generalized approximate message passing (GAMP), which invokes the central limit theorem and Taylor series approximations to dramatically reduce computational complexity. A GAMP toolbox maybe used for message passing on this portion of the graph. Message evaluation implements a first order computation involving the matrix A, the conjugate transpose, $A^H$, and the wavelet transforms $\Psi$ and $\Psi^H$; therefore, fast transforms or parallel hardware for the implementation of A, $A^H$, $\Psi$, and $\Psi^H$ enable computation in seconds, not hours.

Methods

Flow Phantom Data Acquisition

For experimental validation, a CardioFlow 5000 MR flow pump (Shelley Medical Imaging Technologies, Toronto, Ontario, Canada) was used. This programmable pump generates periodic, reproducible flow profiles and is capable of generating a volumetric flow rate of 300 ml/s. The phantom included a water bottle and flexible pipe. The pipe was bent into a u-shape such that two sections of the pipe were aligned in parallel beneath the bottle. The imaging plane was perpendicular to the parallel pipe sections such that in-flow and return-flow to the pump were measured simultaneously. For flow quantification, the two cross-sections of the pipe in each image sequence were treated as separate measurements. The volume passing through each cross section should be the same, but their velocity-time profile may differ.

The CardioFlow 5000 MR comes with two pre-programmed physiological waveforms; one waveform that mimics the femoral flow and the other that mimics the carotid flow. To generate additional waveforms, these two waveforms were modified by the vertical scaling, horizontal scaling, and duty cycle. In total, twelve different waveforms were generated for n=24 unique measurements per acceleration factor. Data were collected on a 1.5 T scanner (Avanto, Siemens Healthcare, Erlangen, Germany) with a 32-channel coil array. The prospectively downsampled data were collected using VISTA for seven different acceleration rates, i.e., R=1, 2, 4, 5, 8, 10 and 16.

All data were collected using a gradient-echo pulse sequence, with TE=2.94 ms, TR=4.92 ms, and VENC=150 cm/s. The datasets were collected using prospectively triggered segmented acquisition, with pseudo-EKG trigger signal generated by the flow pump. The segment size (k-space lines/segment) was set at 4, resulting in a temporal resolution of 39.4 ms that was fixed across all datasets. The matrix size and field of view were 160×160 and 300×300 mm$^2$, respectively. The acquisition time was 40/R pseudo-heartbeats.

In vivo Cardiac Data Acquisition

Figure 4:
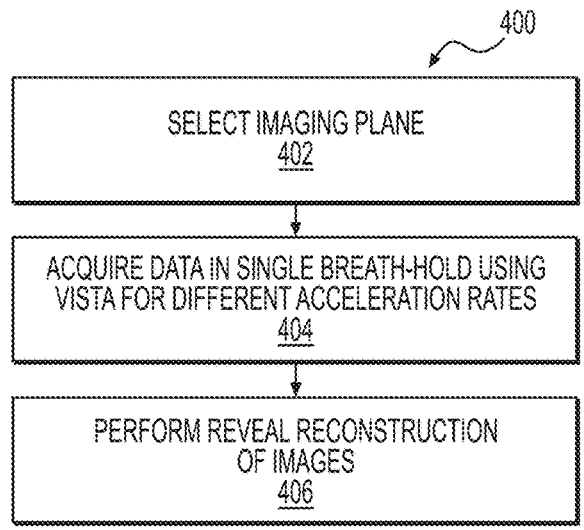
FIG. 4 illustrates a high-level operational flow in accordance with the present disclosure.

With reference to FIG. 4, an operational flow of a method of in vivo data acquisition and reconstruction is described. A healthy volunteer was imaged on the 1.5 T Siemens scanner using an 18-channel coil array. The imaging plane was perpendicular to the ascending aorta and captured cross-sections from both ascending and descending aorta (402). Fully sampled data were acquired in a single breath-hold and retrospectively downsampled to obtain acceleration factors R=1, 2, 4, 6, 8, 10 12, 14 and 16 using VISTA (404). In addition, five healthy volunteers were imaged on the 1.5 T Siemens scanner using an 18-channel coil array. The imaging plane was selected just above the left atrium such that it intersected both ascending and descending aorta. The prospectively downsampled data were collected using VISTA sampling for six different acceleration rates, i.e., R=1, 2, 4, 5, 8, 10 and 16. As a comparative reference, two additional datasets were collected with uniform rate-2 undersampling and fully sampled central k-space for a net acceleration of R=1.74. Each dataset was collected in a separate breath-hold. The reference datasets were collected before and after the six VISTA accelerated acquisitions and were reconstructed using GRAPPA. The flow information from the GRAPPA-reconstructed images was extracted by following the procedure described in Bernstein M A, Grgic M, Brosnan T J, Pelc N J. Reconstructions of Phase Contrast, Phased Array Multicoil Data, Magn Reson Med 1994; 32:330-334, which is incorporated herein by reference in its entirety. Together, these five volunteers, and two cross-sections of aorta, generated ten independent measurements for flow quantification, i.e., n=10.

The data were collected using a gradient-echo pulse sequence, with TE=3.21 ms, TR=5.63 ms for retrospectively downsampled data and TE=3.10 ms and TR=5.17 ms for prospectively sampled data. Each in vivo dataset was collected in a single breath-hold using segmented acquisition with prospective EKG triggering. For the retrospectively downsampled data, the VENC was set at 180 cm/s and the segment size was set at 3, resulting in a temporal resolution of 33.8 ms and acquisition time of 36 heartbeats. For the prospectively sampled data, the VENC was set at 150 cm/s and the segment size was set at 4, resulting in a temporal resolution of 41.3 ms and acquisition time of 40/R heartbeats. The matrix size and field of view were 192×108 and 360×248 mm$^2$, respectively, for retrospectively downsampled data and 160×160 and 300×300 mm$^2$, respectively, for prospectively downsampled data.

Image Reconstruction

The ReVEAL reconstruction was computed off-line using customized Matlab software (Mathworks, Natick, Mass.) running on Red Hat Enterprise Linux with an Intel Core i7-2600 at 3.4 GHz CPU and 8 GB of RAM. Coil sensitivity maps were self-calibrated by averaging undersampled k-space data over all time frames and applying the adaptive array combination method (406). Maxwell correction was applied to all the datasets by incorporating the correction map into the data model given by relationship (8).

The noise variance, $\omega^2$, was automatically estimated from the periphery of k-space for each acquisition, after SVD-based compression from 32 (phantom) or 18 (in vivo) coils to 12 virtual coils. The prior probability of flow, $\gamma$, at each pixel and frame is learned directly from the data using an expectation-maximization procedure. The parameter $\sigma^2$ characterizes the variability between encodings, and was set to $\omega^2/\sqrt{C}$. The relative values of $\lambda$ across the 8 wavelet sub-bands were $\lambda_0 \times \{0.01, 1, 1, 2, 1.2, 2.4, 2.4, 3.6\}$. These relative values were determined by application of an automated procedure to a separate in vivo data set and were held fixed across all acceleration rates and for both phantom and in vivo data. The single algorithm parameter requiring ad hoc tuning was $\lambda_0$, which sets a global scaling of the wavelet regularization. Herein, $\lambda_0 = 0.7$ may be employed for all in vivo data and $\lambda_0 = 4$ for the flow phantom data. Daubechies db1 wavelets were used in the spatial dimensions and db3 wavelets in the temporal dimension.

ReVEAL is compared with k-t SPARSE-SENSE as well as ReVEAL with the mixture density omitted, termed "ReVEAL no mixture." Although the ReVEAL no mixture reconstruction relies on over-complete spatio-temporal wavelets, a squared-error penalty for data fidelity, optimized VISTA sampling patterns, and message passing computation, it does not assume any relationship between encodings. Comparison between ReVEAL and ReVEAL no mixture is intended to highlight the benefit from the regularizing effect of the proposed statistical model between encodings in relationship (8). A code to implement k-t SPARSE-SENSE was provided by Daniel Kim, Li Feng, and Hassan Haji-Valizadeh. Reconstruction times for the prospectively downsampled in vivo dataset at R=10 were approximately 6.5 minutes, 3.5 minutes, and 7 minutes, for ReVEAL, ReVEAL no mixture, and k-t SPARSE-SENSE, respectively.

Data Analysis

Peak velocity (PV) and stroke volume (SV) were used as quantitative measures of fidelity. The PV is defined as the maximum velocity across all pixels and frames within a region of interest (ROI). The SV is defined as the volume of blood or fluid passing through an ROI for one heartbeat or pump cycle. ROIs were identified for each image series by manually segmenting the pipes or blood vessels from the magnitude images. To capture the motion of the aorta during the heartbeat, each ROI was manually shifted from frame-to-frame. The size of the ROI was held constant across different acceleration rates and frames to limit variation in PV and SV due to ROI selection.

For phantom imaging and retrospectively downsampled in vivo data, the reconstructions corresponding to R=1 (fully sampled) data were used as reference. For the prospectively accelerated in vivo data, data reconstructed at R=1.74 with GRAPPA were used as reference. Bland-Altman plots—one for each acceleration rate—were used to display PV and SV. To quantify variations due to physiological changes, an additional Bland-Altman plot was created comparing the two R=1.74 GRAPPA reconstructions.

The retrospectively downsampled in vivo dataset, collected from a single volunteer, does not mimic the real-life acquisition process but is included because it does not suffer from physiological variations present in the prospectively sampled datasets. In the retrospectively accelerated case, the reference is know precisely, thus guaranteeing the same velocity-time profile for each acceleration. A Bland-Altman plot was not constructed for the retrospectively downsampled in vivo data due to the small sample size. However, normalized mean squared error (NMSE) and the structural similarity index (SSIM) for the velocity map were calculated for each acceleration rate. NMSE is defined as:

$$NMSE = 10\log_{10}\left(\frac{\|x_{ref} - \hat{x}_R\|_2^2}{\|x_{ref}\|_2^2}\right), \quad (16)$$

where $x_{ref}$ is the noisy reference from fully sampled data and $\hat{x}_R$ the reconstructed image from acceleration rate R. $x_{ref}$ and $\hat{x}_R$ were formed from the compensated image magnitude and velocity encoded phase, i.e., $|x_b e^{j\theta_v}|$.

Results

Retrospectively Accelerated In Vivo Data

Figure 5B:
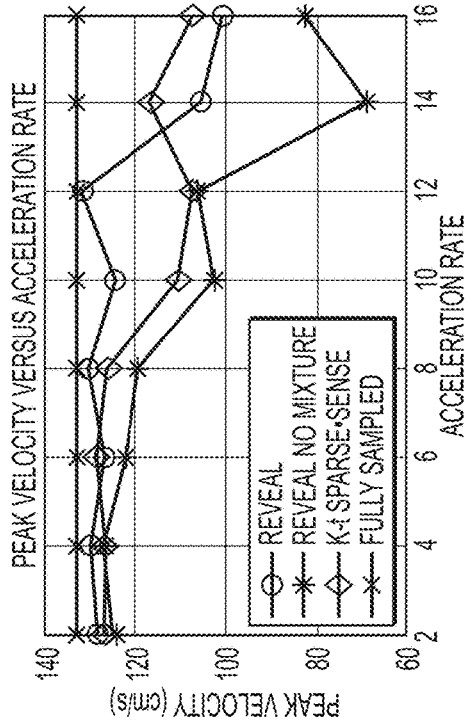
FIGS. 5A-5D illustrate retrospectively accelerated in vivo results in accordance with the present disclosure.
Figure 5D:
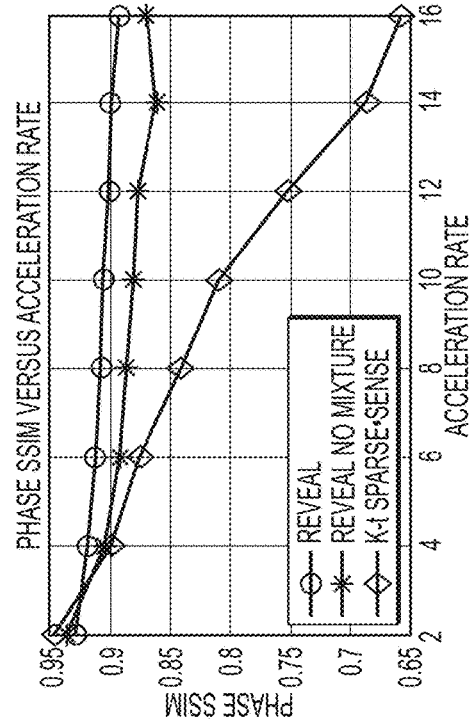
Figure 5A:
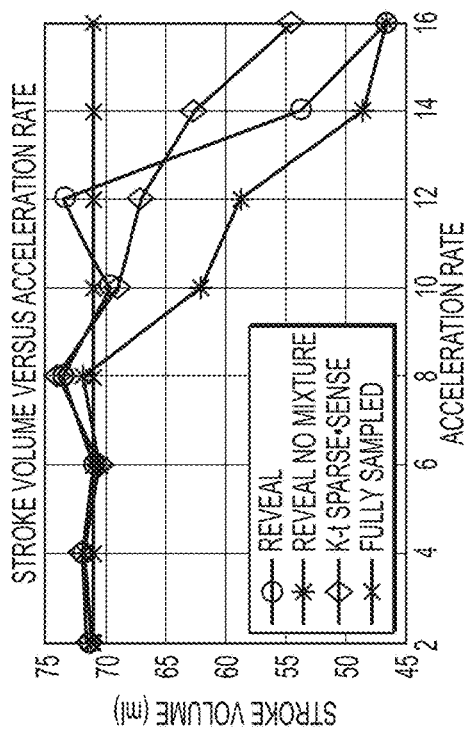
Figure 5C:
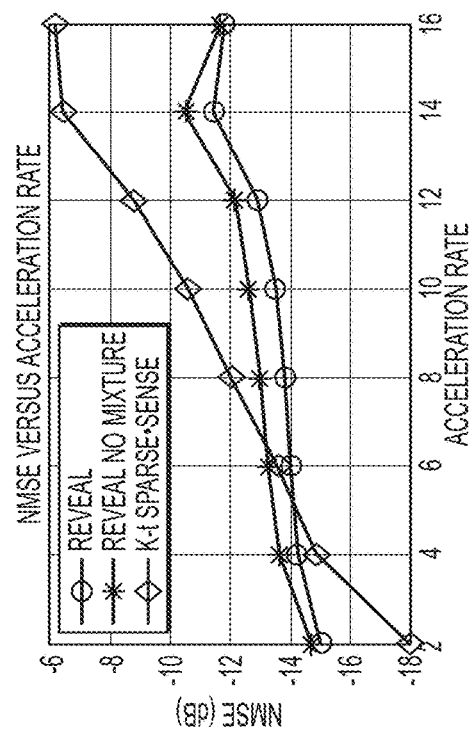

The retrospectively downsampled image sequences were reconstructed using ReVEAL, ReVEAL no mixture, and k-t SPARSE-SENSEs; results are shown in FIGS. 5A-5D, which illustrate a summary of retrospectively accelerated in vivo data quality metrics. For the summary shown in FIGS. 5A-5D, a fully sampled through-plane image of the ascending aorta was acquired and retrospectively accelerated for rates R=2, 4, 6, 8, 10, 12, 14, and 16. ReVEAL, ReVEAL no mixture, and k-t SPARSE-SENSE are compared to fully sampled data. In particular, FIG. 5A shows the SV in the ascending aorta versus acceleration rate. FIG. 5B shows the peak velocity in the ascending aorta versus acceleration rate. FIG. 5C shows the NMSE in dB versus acceleration rate. The images used to calculate NMSE were obtained by forming a complex number with magnitude equal to the compensated image magnitude, i.e., $|xb|$, and phase equal to the velocity encoded phase, i.e., $\theta_v$, d. FIG. 5D shows the SSIM for the velocity encoded phase image versus acceleration rate. The phase SSIM measurement was performed only on pixels within the top 95% of magnitude value in the reference image.

The PV and SV were calculated inside the ascending aorta and plotted versus acceleration rate R. Results from R=1 were calculated using the adaptive array combination method and are given as a reference. As shown in FIGS. 5A-5B, quantitative fidelity of SV and PV was preserved to an acceleration factor of R=12. For R≤12, the PV and SV were within 6.5% and 2.5% of the reference, respectively. Additionally, ReVEAL showed the lowest NMSE for R≥6, and highest velocity SSIM for R≥4. Images from fully sampled data and R=12 data for ReVEAL, ReVEAL no mixture, and k-t SPARSE-SENSE are shown in rows c and d of FIG. 7, which shows retrospectively accelerated in vivo data reconstructed at R=12. In FIG. 7, ReVEAL, ReVEAL no mixture, and k-t SPARSE-SENSE are compared to the fully sampled data for one representative frame. The first column was reconstructed from fully sampled data using an adaptive array combination method. The remaining columns were reconstructed from R=12 accelerated data with ReVEAL, ReVEAL no mixture, and k-t SPARSE-SENSE. Row a shows the reconstructed, normalized magnitude images. Row b shows the absolute difference in magnitude between the accelerated images and the fully sampled image. Row c shows the velocity maps in cm/s. Row d shows the absolute difference between the fully sampled velocity map and the velocity map recovered from accelerated data. The difference was taken for pixels within the top 90% of magnitude in the reference image to avoid large differences due to low magnitude phase noise.

As evident in rows c and d of FIG. 7, ReVEAL greatly reduced aliasing artifacts and showed increased accuracy of velocities in the ascending aorta. The spatial regularization used in ReVEAL and ReVEAL no mixture greatly reduced background noise in the magnitude image at the cost of spatial blurring, as shown in rows a and b of FIG. 7. For R=10, the velocity-time profiles for mean and peak velocities are shown in FIGS. 6A-6B.

Figure 6A:
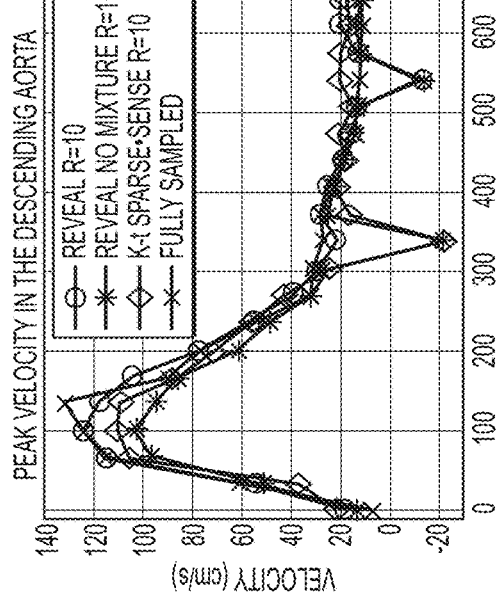
FIGS. 6A-6D illustrate representative velocity-time profiles from in vivo data.
Figure 6B:
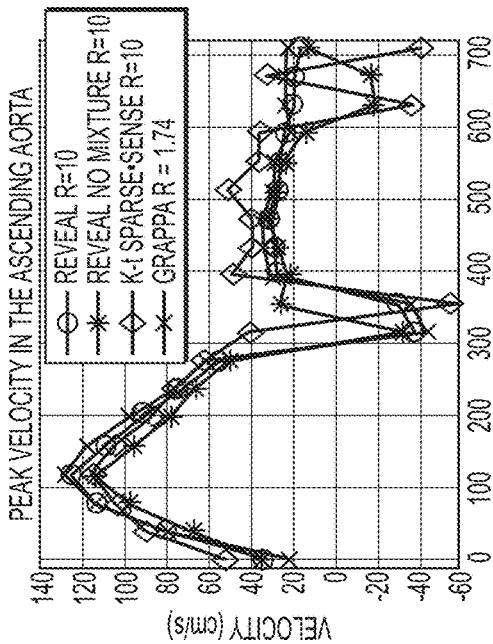
Figure 6C:
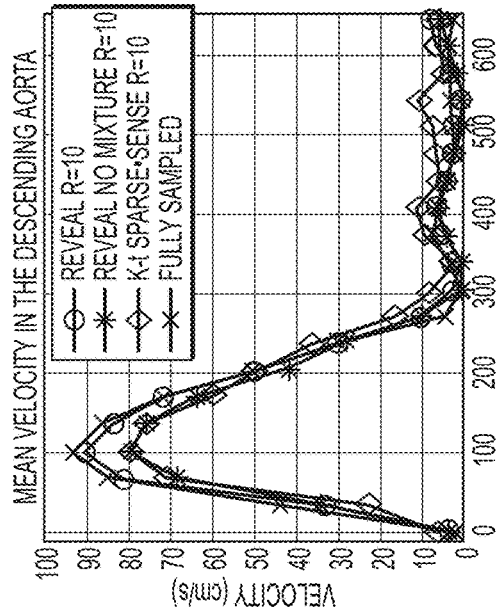
Figure 6D:
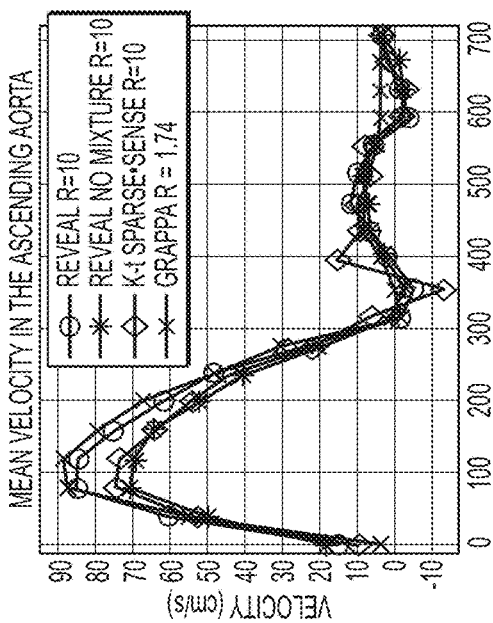

FIGS. 6A-6D show representative velocity-time profiles from in vivo data. FIG. 6A shows the mean velocity in an ROI versus time in the descending aorta from retrospectively accelerated in vivo data at R=10. ReVEAL, ReVEAL no mixture, and k-t SPARSE-SENSE are compared to fully sampled data. FIG. 6B shows the peak velocity in an ROI versus time in the descending aorta from retrospectively accelerated in vivo data. FIG. 6C shows the mean velocity in an ROI versus time in the ascending aorta from prospectively accelerated in vivo data at R=10. ReVEAL, ReVEAL no mixture, and k-t SPARSE-SENSE are compared to GRAPPA at R=1.74. FIG. 6D shows the peak velocity in an ROI versus time in the ascending aorta from prospectively accelerated in vivo data.

Figure 9B:
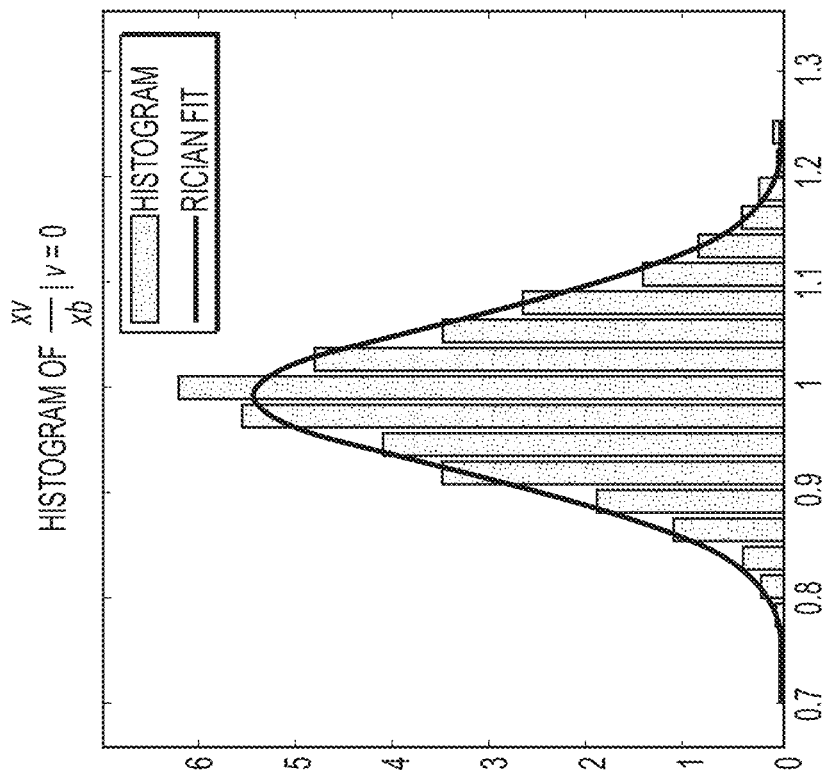
FIGS. 9A-9B illustrates an evaluation of ReVEAL modeling choices using images from fully sampled in vivo data.
Figure 9A:
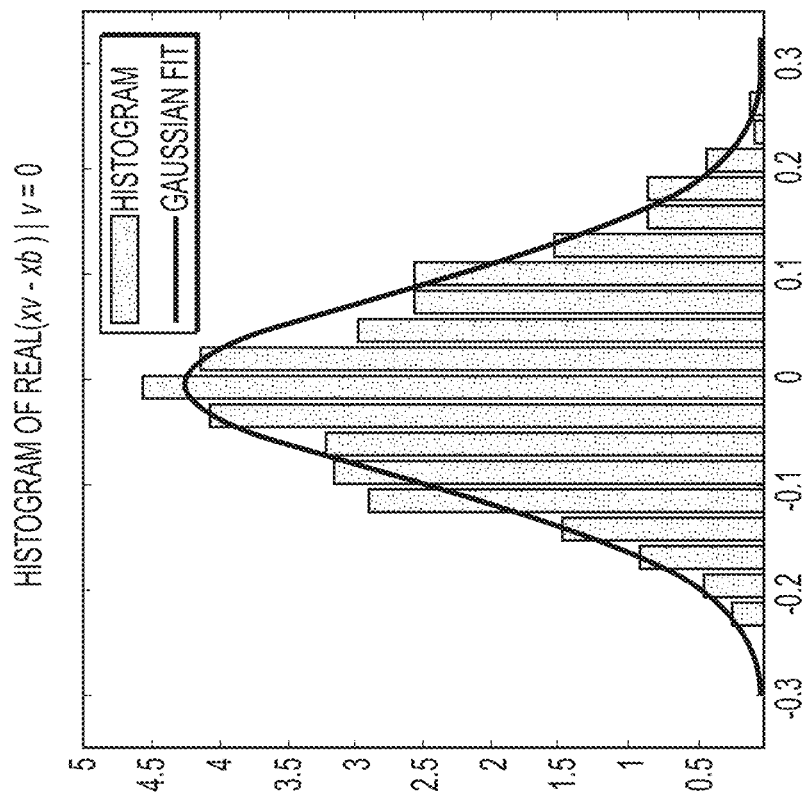

To examine the modeling choice in Eq. (8), histograms were constructed from fully sampled data, as shown in FIGS. 9A-9B. FIG. 9A shows the real part of the complex difference between the encoded images, $x_v - x_b$, for a zero-velocity region; a chi-square goodness-of-fit accepts the hypothesis of a Gaussian distribution with a 5% significance level. Additionally, for pixels taken from a region inside the descending aortic arch. FIG. 9B shows the histogram of the ratio of the magnitudes; a chi-square goodness-of-fit accepts the hypothesis of a Rician distribution with a 5% significance level.

Prospectively Accelerated Phantom Data

The phantom data were reconstructed using ReVEAL, ReVEAL no mixture, and k-t SPARSE-SENSE; the fully sampled data, reconstructed with the adaptive array combination array combination method, were used as reference. The resulting Bland-Altman analyses and Pearson correlation coefficients are tabulated in Table 1.

Figure 10:
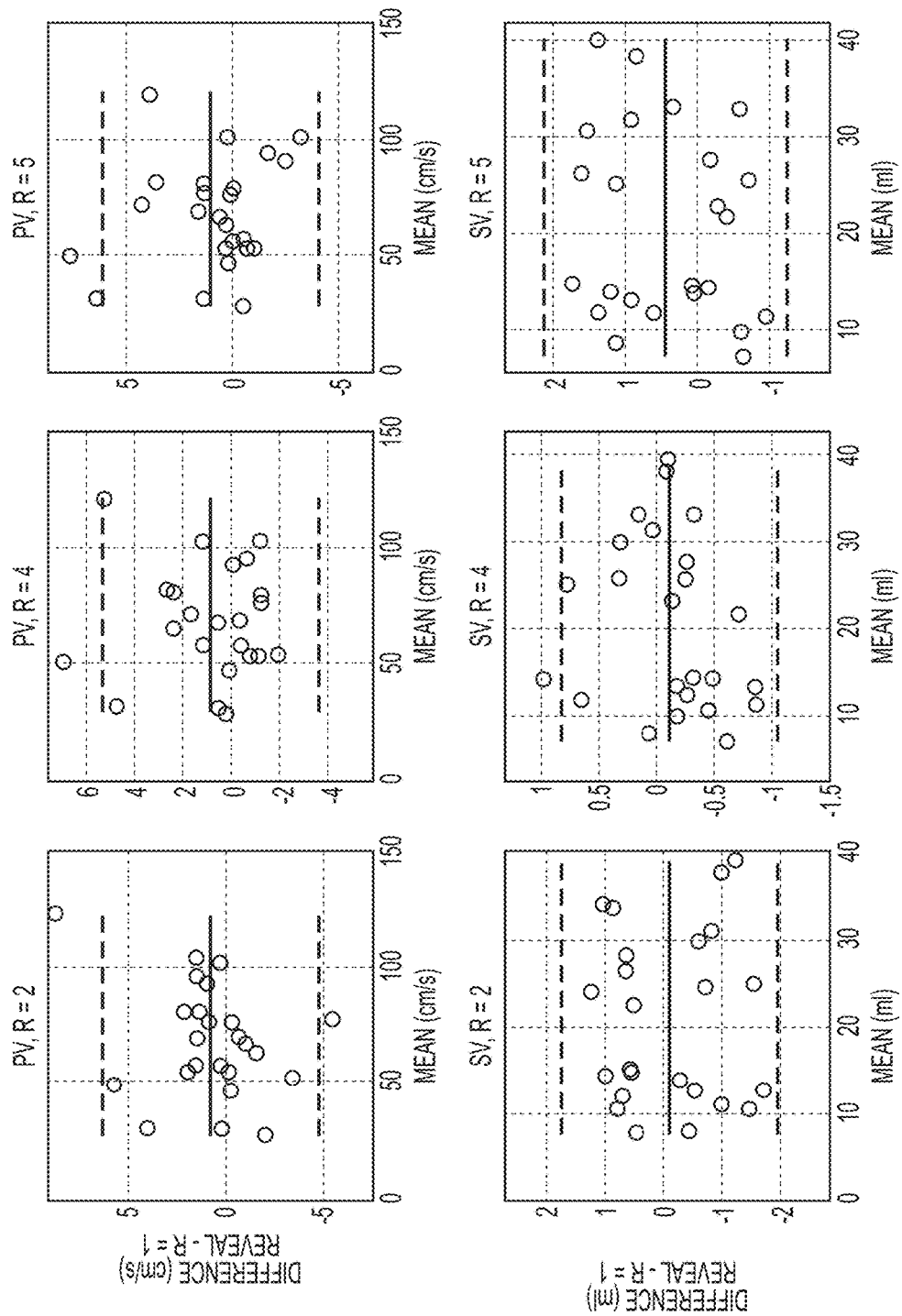
FIG. 10 illustrates Bland-Altman analyses for prospectively accelerated phantom data reconstructed with ReVEAL.
Figure 10:
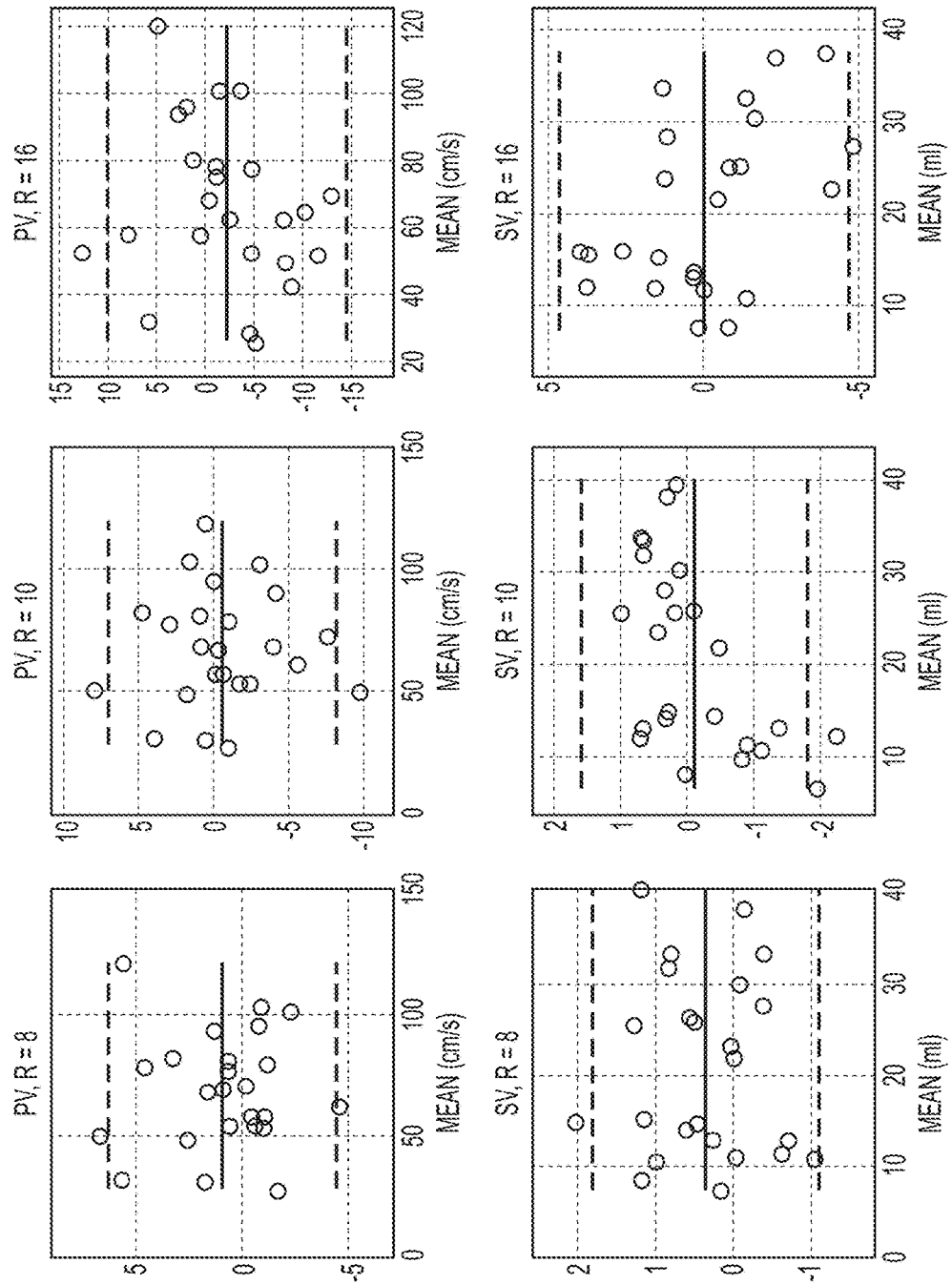
Figure 11:
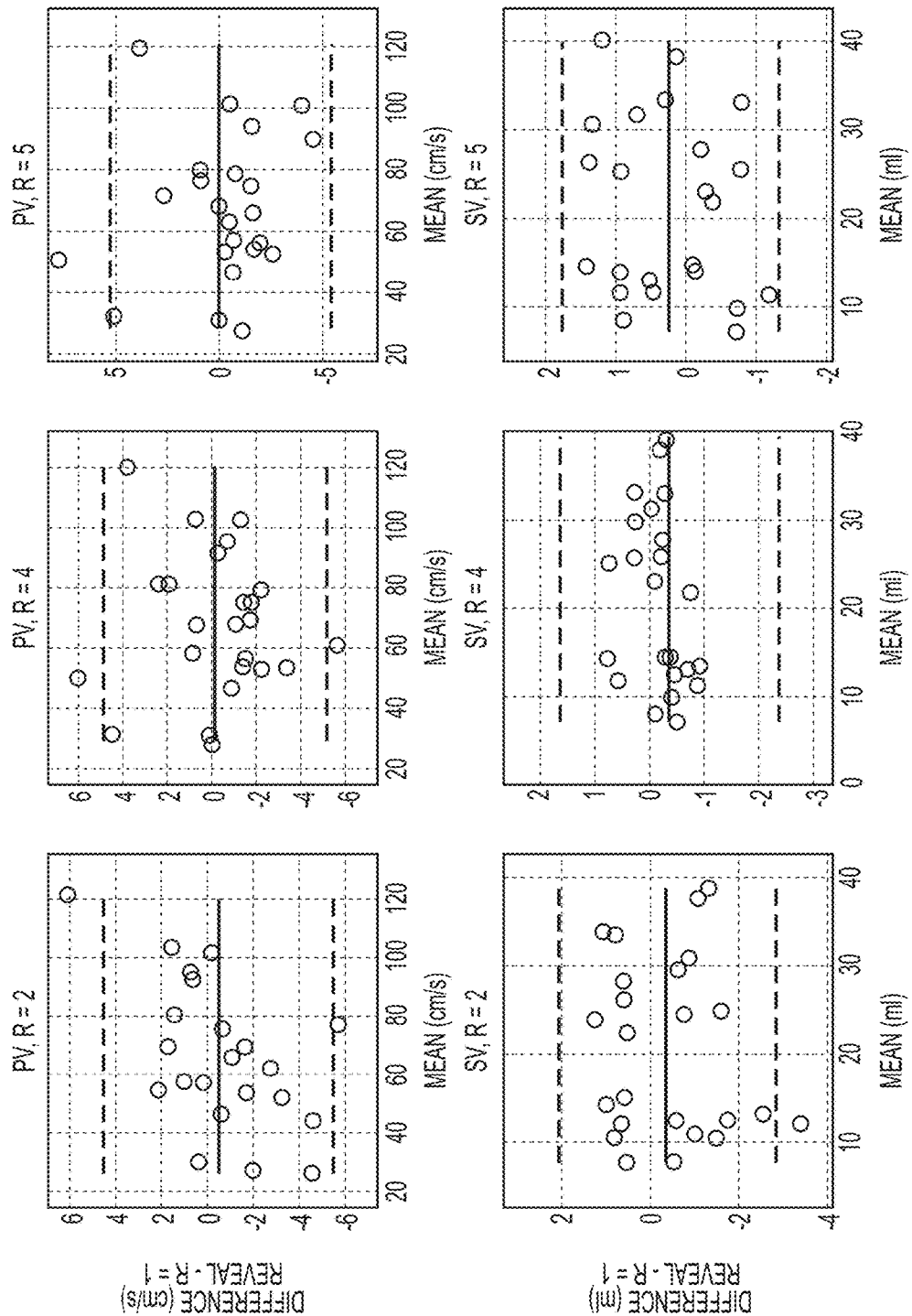
FIG. 11 illustrates Bland-Altman analyses for prospectively accelerated phantom data reconstructed with ReVEAL no mixture.
Figure 11:
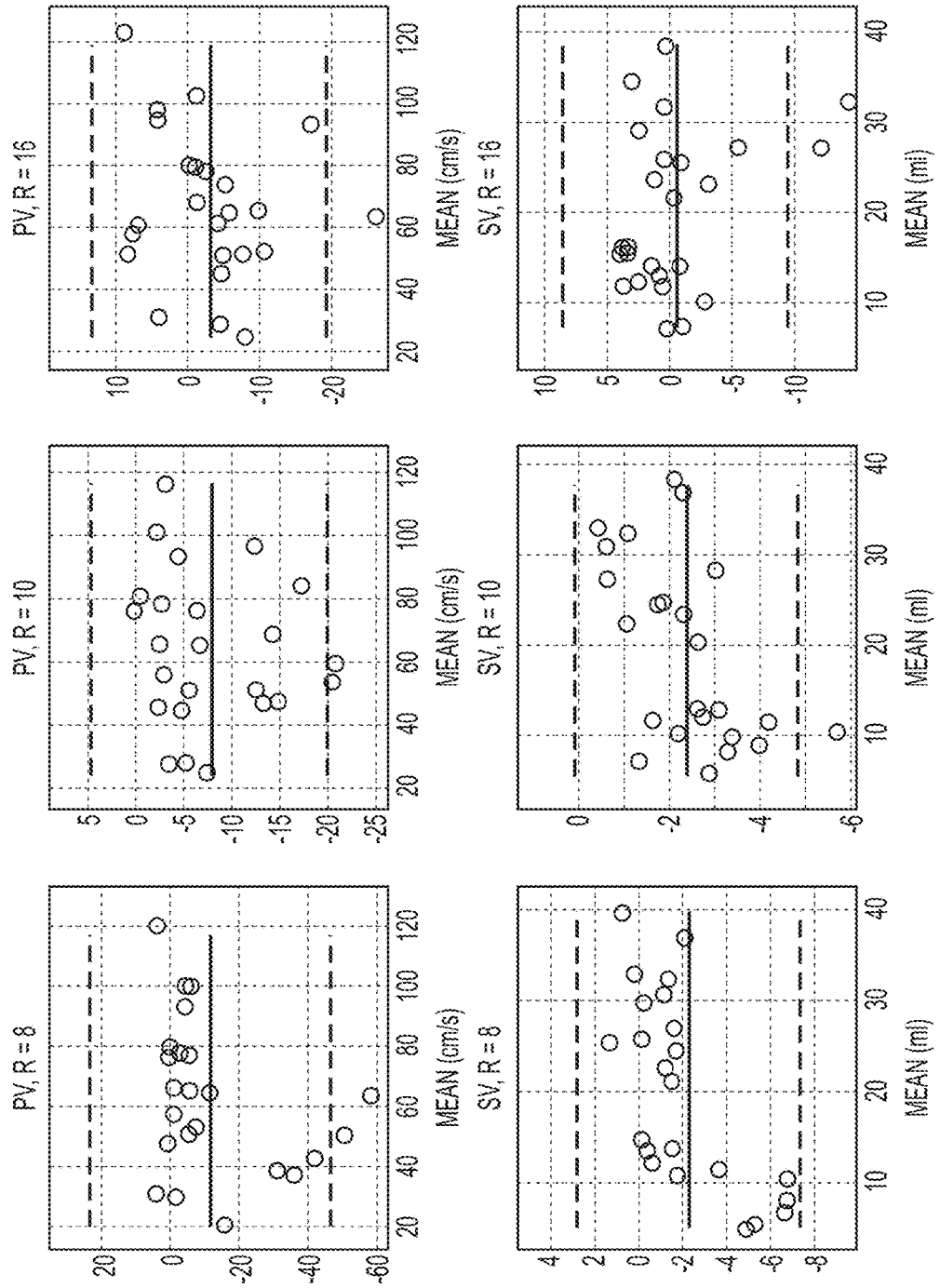
Figure 12:
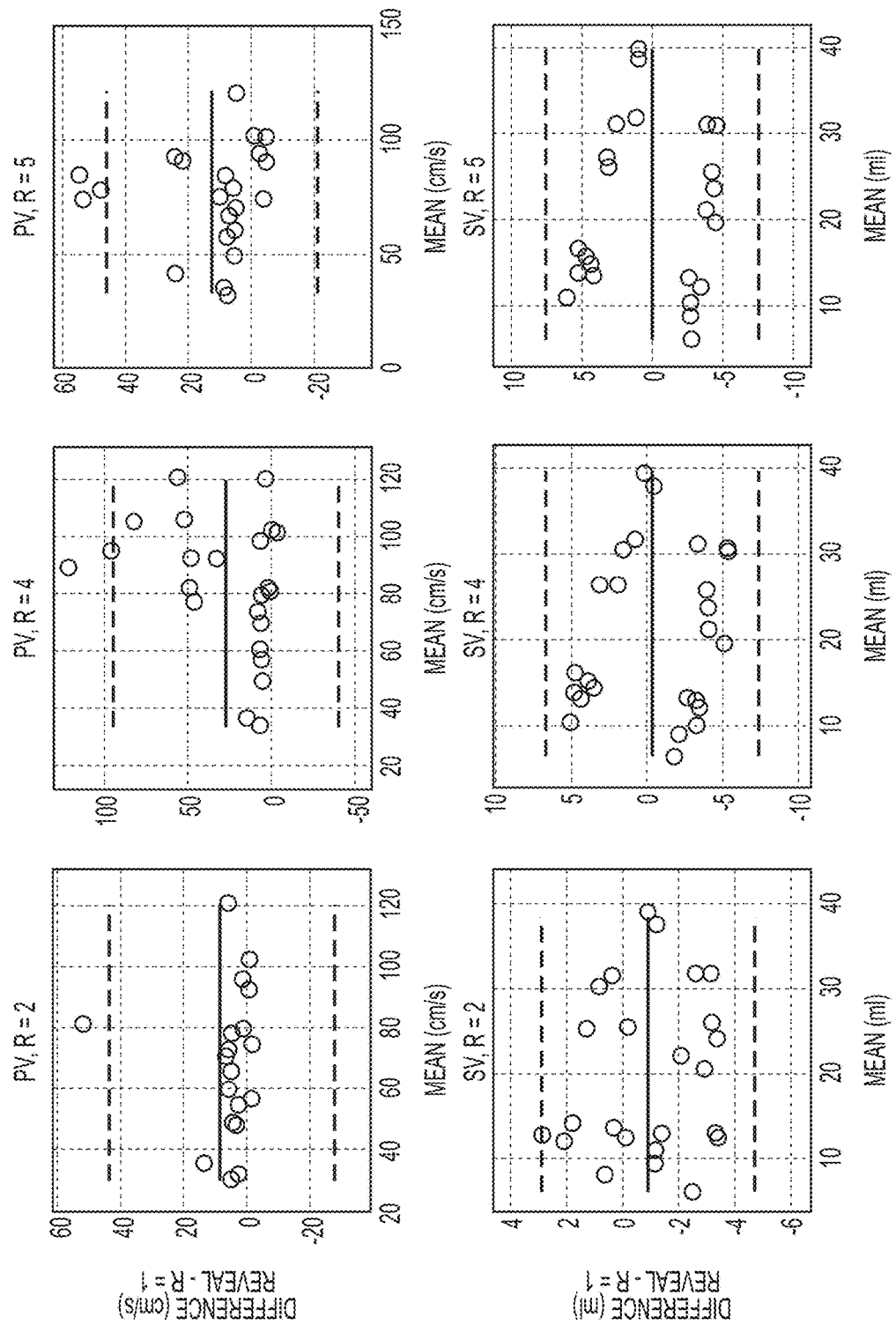
FIG. 12 illustrates Bland-Altman analyses for prospectively accelerated phantom data reconstructed with k-t SPARSE-SENSE.
Figure 12:
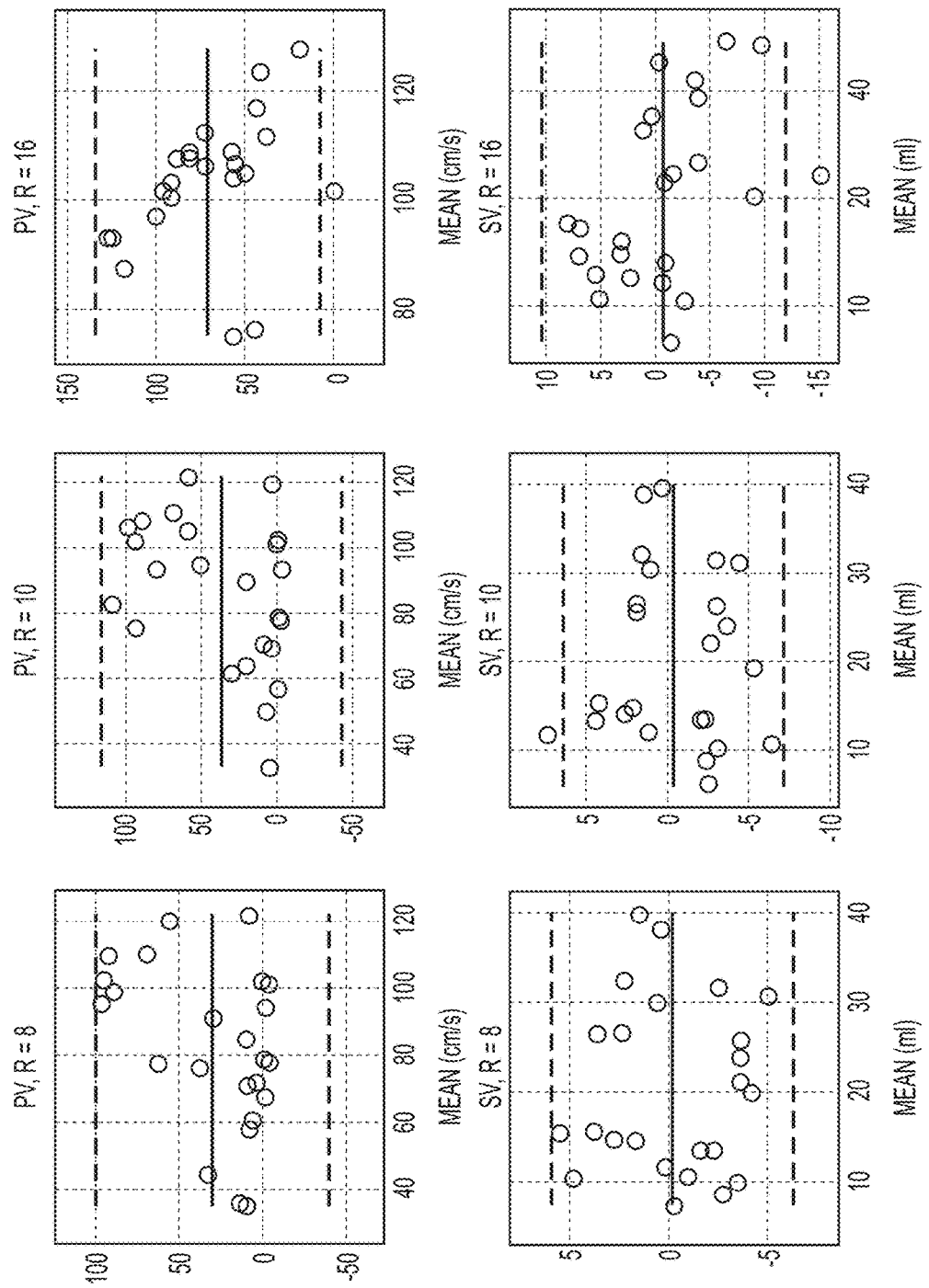

The corresponding Bland-Altman plots are provided in FIGS. 10-12. FIG. 10 illustrates Bland-Altman analyses for prospectively accelerated phantom data reconstructed with ReVEAL. Each column in the figure represents a different acceleration rate R. The top row contains results for peak velocity (PV); the bottom row contains results for stroke volume (SV). The solid line represents the mean difference, and dashed lines represent the 95% confidence intervals (mean±1.96×standard deviation).

FIG. 11 illustrates Bland-Altman analyses for prospectively accelerated phantom data reconstructed with ReVEAL no mixture. Each column in the figure represents a different acceleration rate R. The top row contains results for peak velocity (PV); the bottom row contains results for stroke volume (SV). The solid line represents the mean difference, and dashed lines represent the 95% confidence intervals (mean±1.96×standard deviation).

FIG. 12 illustrates Bland-Altman analyses for prospectively accelerated phantom data reconstructed with k-t SPARSE-SENSE. Each column in the figure represents a different acceleration rate R. The top row contains results for peak velocity (PV); the bottom row contains results for stroke volume (SV). The solid line represents the mean difference, and dashed lines represent the 95% confidence intervals (mean±1.96×standard deviation).

The variability of ReVEAL is low up to R=10, increasing only moderately compared to R=2. The fidelity of reconstruction is therefore preserved to an acceleration factor R=10. Fidelity of PV and SV is, however, lost at R=16 as seen in the negative bias and increased variance. In comparison, ReVEAL no mixture compares favorably to ReVEAL at low acceleration rates but degrades significantly beyond R=5, and k-t SPARSESENSE exhibits large variances. Also, the Pearson correlation coefficients for ReVEAL are consistently higher than those of ReVEAL no mixture and k-t SPARSESENSE.

TABLE 1

Tabulated values from Bland-Altman and Pearson correlation analyses for prospectively accelerated flow phantom data. Here, $\mu_d$ is the mean difference, $\sigma_d$ is the standard deviation of the difference, and r is the Pearson correlation coefficient. ReVEAL, ReVEAL no mixture, and k-t SPARSE-SENSE are compared to fully sampled data. The lowest absolute mean difference, lowest standard deviation, and highest Pearson correlation coefficient for each acceleration rate is in bold.
Prospectively Accelerated Phantom Compared to Fully Sampled Data

|  |  | R = 2 | | | R = 4 | | | R = 5 | | | R = 8 | | |
| --- | --- | --- | --- | --- | --- | --- | --- | --- | --- | --- | --- | --- | --- |
|  |  | $\mu_d$ | $\sigma_d$ | r | $\mu_d$ | $\sigma_d$ | r | $\mu_d$ | $\sigma_d$ | r | $\mu_d$ | $\sigma_d$ | r |
| ReVEAL | SV (mL) | −0.11 | 0.95 | 0.99 | −0.11 | 0.47 | 0.99 | 0.44 | 0.87 | 0.99 | 0.35 | 0.75 | 0.99 |
| ReVEAL no mixture | SV (mL) | −0.40 | 1.24 | 0.99 | −0.36 | 1.02 | 0.99 | 0.25 | 0.79 | 0.99 | −2.28 | 2.69 | 0.99 |
| k-t SPARSE-SENSE | SV (mL) | −0.18 | 0.96 | 0.99 | −0.25 | 0.49 | 0.99 | 0.21 | 0.82 | 0.99 | −0.13 | 2.03 | 0.99 |
| ReVEAL | PV (cm/s) | 0.72 | 2.81 | 0.99 | 0.83 | 2.30 | 0.99 | 0.95 | 2.61 | 0.99 | 0.87 | 2.72 | 0.99 |
| ReVEAL no mixture | PV (cm/s) | −0.52 | 2.60 | 0.99 | −0.13 | 2.54 | 0.99 | −0.12 | 2.72 | 0.99 | −11.53 | 17.93 | 0.79 |
| k-t SPARSE-SENSE | PV (cm/s) | 0.25 | 2.72 | 0.99 | 0.59 | 2.39 | 0.99 | 0.43 | 2.80 | 0.99 | 4.04 | 11.37 | 0.90 |

|  |  | R = 10 | | | R = 16 | | |
| --- | --- | --- | --- | --- | --- | --- | --- |
|  |  | $\mu_d$ | $\sigma_d$ | r | $\mu_d$ | $\sigma_d$ | r |
| ReVEAL | SV (mL) | −0.11 | 0.87 | 0.99 | −0.08 | 2.39 | 0.96 |
| ReVEAL no mixture | SV (mL) | −2.38 | 1.26 | 0.99 | −0.53 | 4.55 | 0.89 |
| k-t SPARSE-SENSE | SV (mL) | −0.57 | 1.18 | 0.99 | −0.84 | 5.74 | 0.83 |
| ReVEAL | PV (cm/s) | −0.62 | 3.83 | 0.99 | −2.10 | 6.30 | 0.97 |
| ReVEAL no mixture | PV (cm/s) | −7.67 | 6.33 | 0.97 | −2.78 | 8.27 | 0.96 |
| k-t SPARSE-SENSE | PV (cm/s) | 0.72 | 3.48 | 0.99 | 13.76 | 26.70 | −0.55 |

Prospectively Accelerated In Vivo Data

The prospectively sampled in vivo data were reconstructed using ReVEAL, ReVEAL no mixture, and k-t SPARSE-SENSE. The GRAPPA reconstructions at R=1.74, were used as reference. The resulting Bland—Altman analyses and Pearson correlation coefficients are tabulated in Table 2.

TABLE 2

Tabulated values from Bland-Altman and Pearson correlation analyses for prospectively accelerated in vivo data. Here, $\mu_d$ is the mean difference, $\sigma_d$ is the standard deviation of the difference, and r is the Pearson correlation coefficient. ReVEAL, ReVEAL no mixture, and k-t SPARSE-SENSE are compared to GRAPPA at R = 1.74. The lowest absolute mean difference, lowest standard deviation, and highest Pearson correlation coefficient for each acceleration rate is in bold.

Prospectively Accelerated in Vivo Compared to GRAPPA R = 1.74

|  |  | R = 2 | | | R = 4 | | | R = 5 | | | R = 8 | | |
| --- | --- | --- | --- | --- | --- | --- | --- | --- | --- | --- | --- | --- | --- |
|  |  | $\mu_d$ | $\sigma_d$ | r | $\mu_d$ | $\sigma_d$ | r | $\mu_d$ | $\sigma_d$ | r | $\mu_d$ | $\sigma_d$ | r |
| ReVEAL | SV (mL) | 2.49 | 3.92 | 0.98 | −0.97 | 4.92 | 0.97 | −2.78 | 4.07 | 0.98 | −2.90 | 8.51 | 0.98 |
| ReVEAL no mixture | SV (mL) | 2.05 | 3.76 | 0.98 | −1.55 | 4.48 | 0.97 | −3.04 | 3.71 | 0.88 | −6.00 | 8.10 | 0.91 |
| k-t SPARSE-SENSE | SV (mL) | −2.73 | 10.24 | 0.93 | −5.28 | 9.62 | 0.94 | −7.31 | 7.54 | 0.94 | −8.47 | 7.68 | 0.93 |
| ReVEAL | PV (cm/s) | 5.55 | 10.79 | 0.80 | 3.70 | 13.42 | 0.67 | −0.54 | 10.98 | 0.81 | −5.87 | 11.31 | 0.73 |
| ReVEAL no mixture | PV (cm/s) | 4.32 | 10.15 | 0.83 | 0.04 | 14.18 | 0.61 | −2.56 | 11.18 | 0.80 | −13.06 | 12.60 | 0.70 |
| k-t SPARSE-SENSE | PV (cm/s) | 6.24 | 13.99 | 0.85 | 8.34 | 12.55 | 0.83 | 3.32 | 13.99 | 0.81 | 3.89 | 16.48 | 0.82 |

|  |  | R = 10 | | | R = 16 | | |
| --- | --- | --- | --- | --- | --- | --- | --- |
|  |  | $\mu_d$ | $\sigma_d$ | r | $\mu_d$ | $\sigma_d$ | r |
| ReVEAL | SV (mL) | −2.08 | 3.95 | 0.96 | −13.01 | 10.17 | 0.85 |
| ReVEAL no mixture | SV (mL) | −6.87 | 6.45 | 0.94 | −36.87 | 18.70 | 0.17 |
| k-t SPARSE-SENSE | SV (mL) | −10.58 | 10.32 | 0.90 | −14.71 | 17.43 | 0.55 |
| ReVEAL | PV (cm/s) | −7.57 | 11.74 | 0.82 | −18.31 | 10.07 | 0.82 |
| ReVEAL no mixture | PV (cm/s) | −18.27 | 13.85 | 0.82 | −73.52 | 15.95 | 0.79 |
| k-t SPARSE-SENSE | PV (cm/s) | 2.12 | 21.21 | 0.79 | 8.01 | 22.39 | 0.55 |

Figure 13:
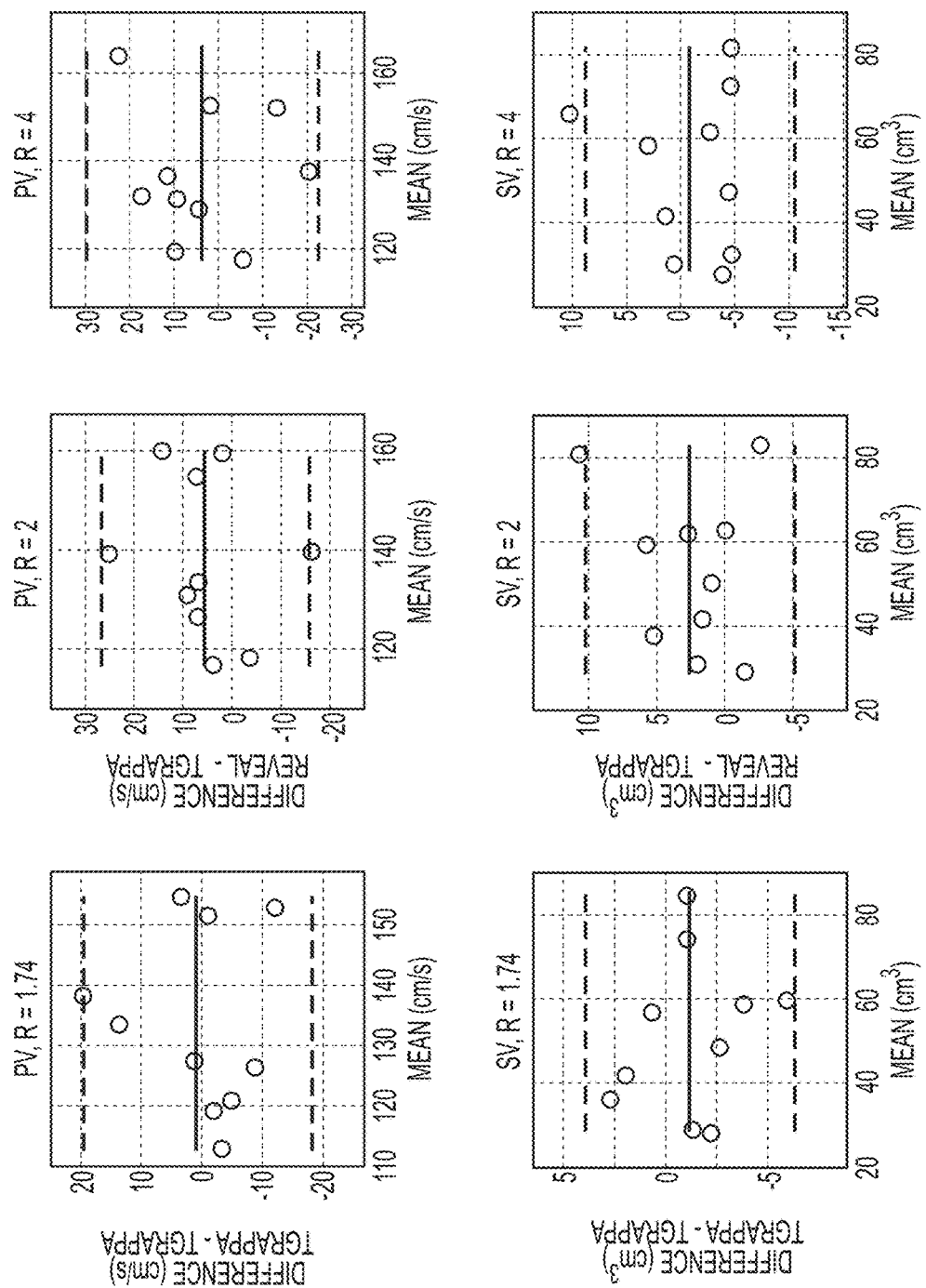
FIG. 13 illustrates Bland-Altman analyses for prospectively accelerated in vivo data reconstructed with ReVEAL.
Figure 13:
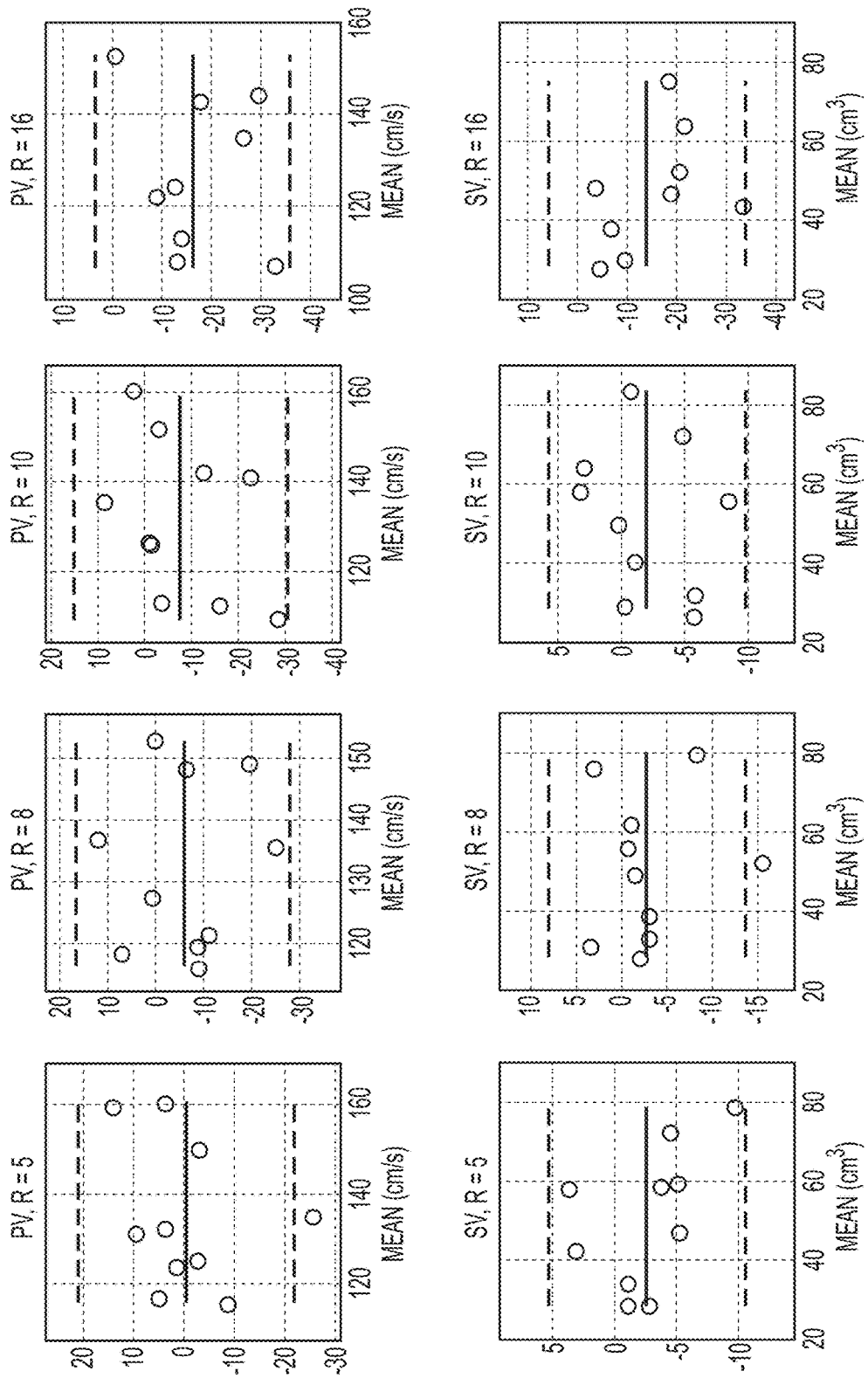
Figure 14:
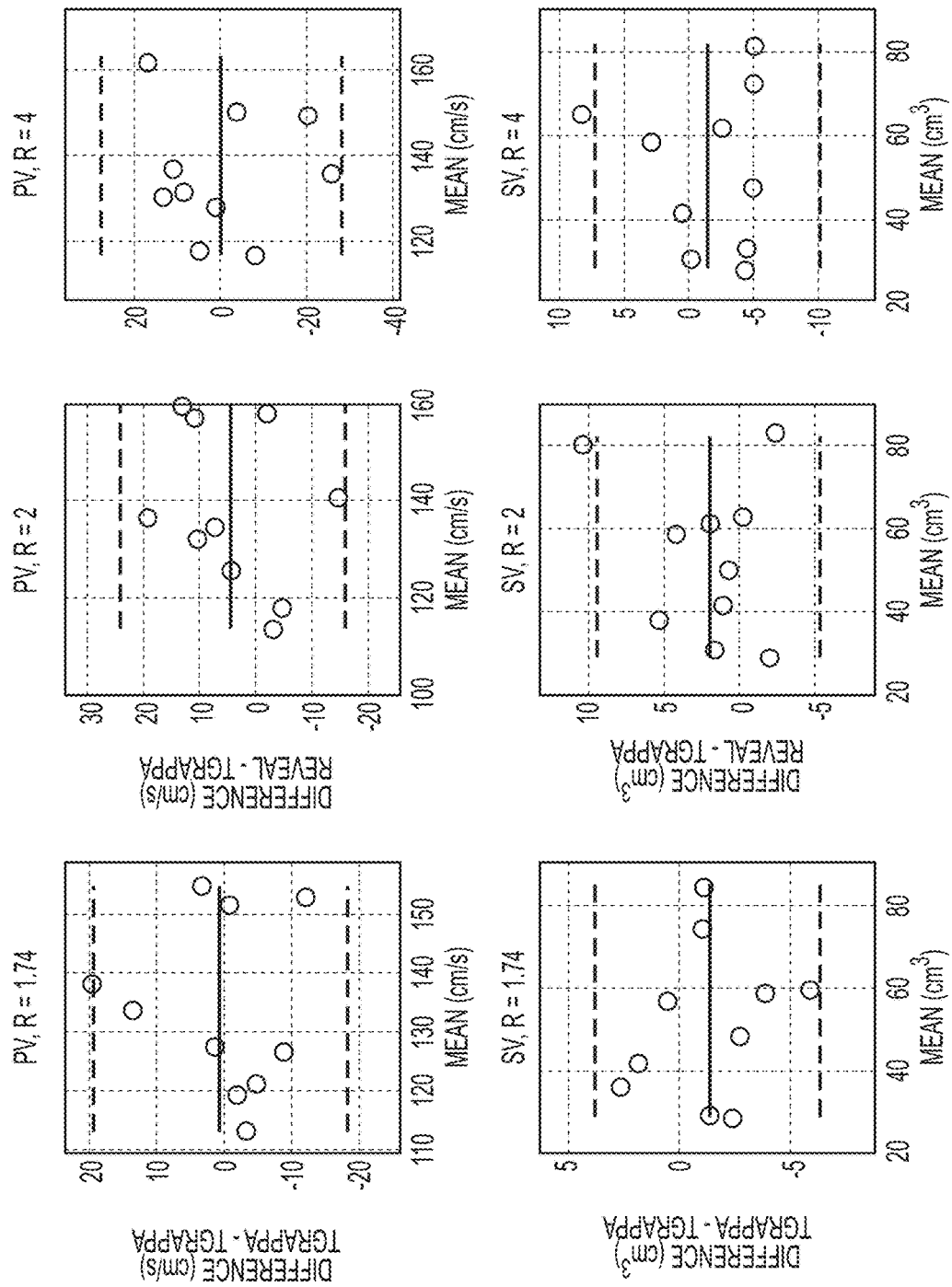
FIG. 14 illustrates Bland-Altman analyses for prospectively accelerated in vivo data reconstructed with ReVEAL no mixture.
Figure 14:
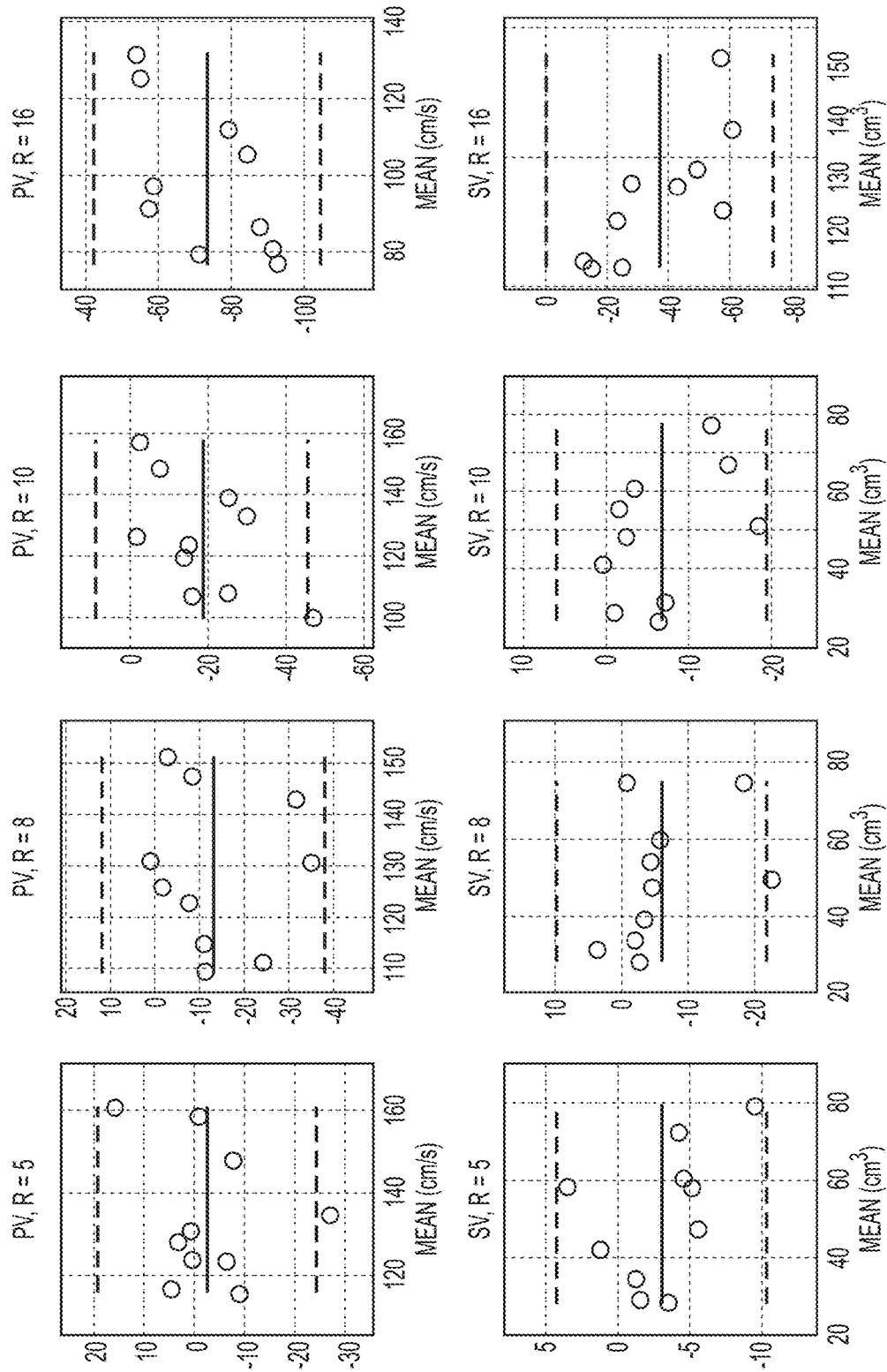
Figure 15:
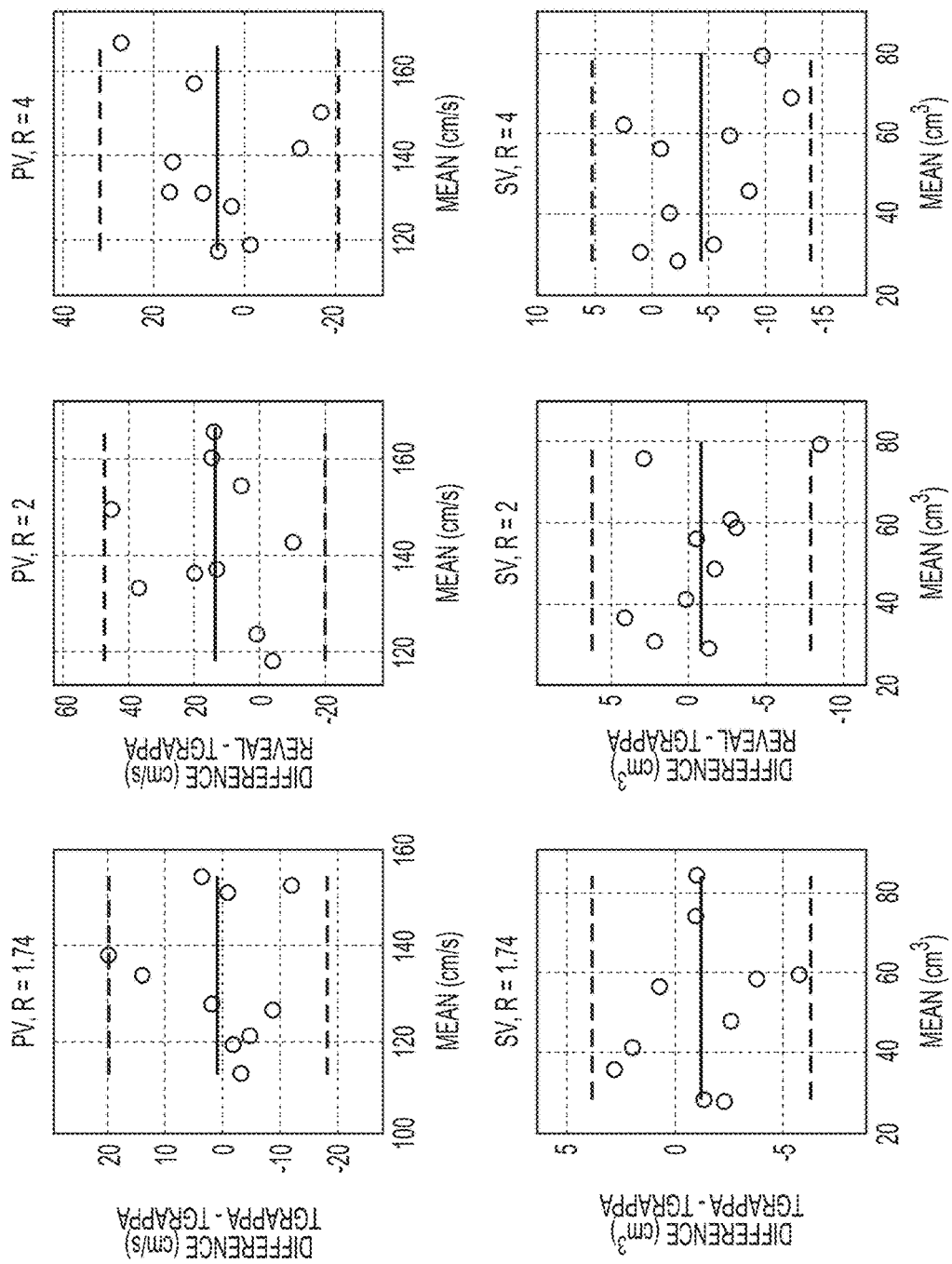
FIG. 15 illustrates Bland-Altman analyses for prospectively accelerated in vivo data reconstructed with k-t SPARSE-SENSE.
Figure 15:
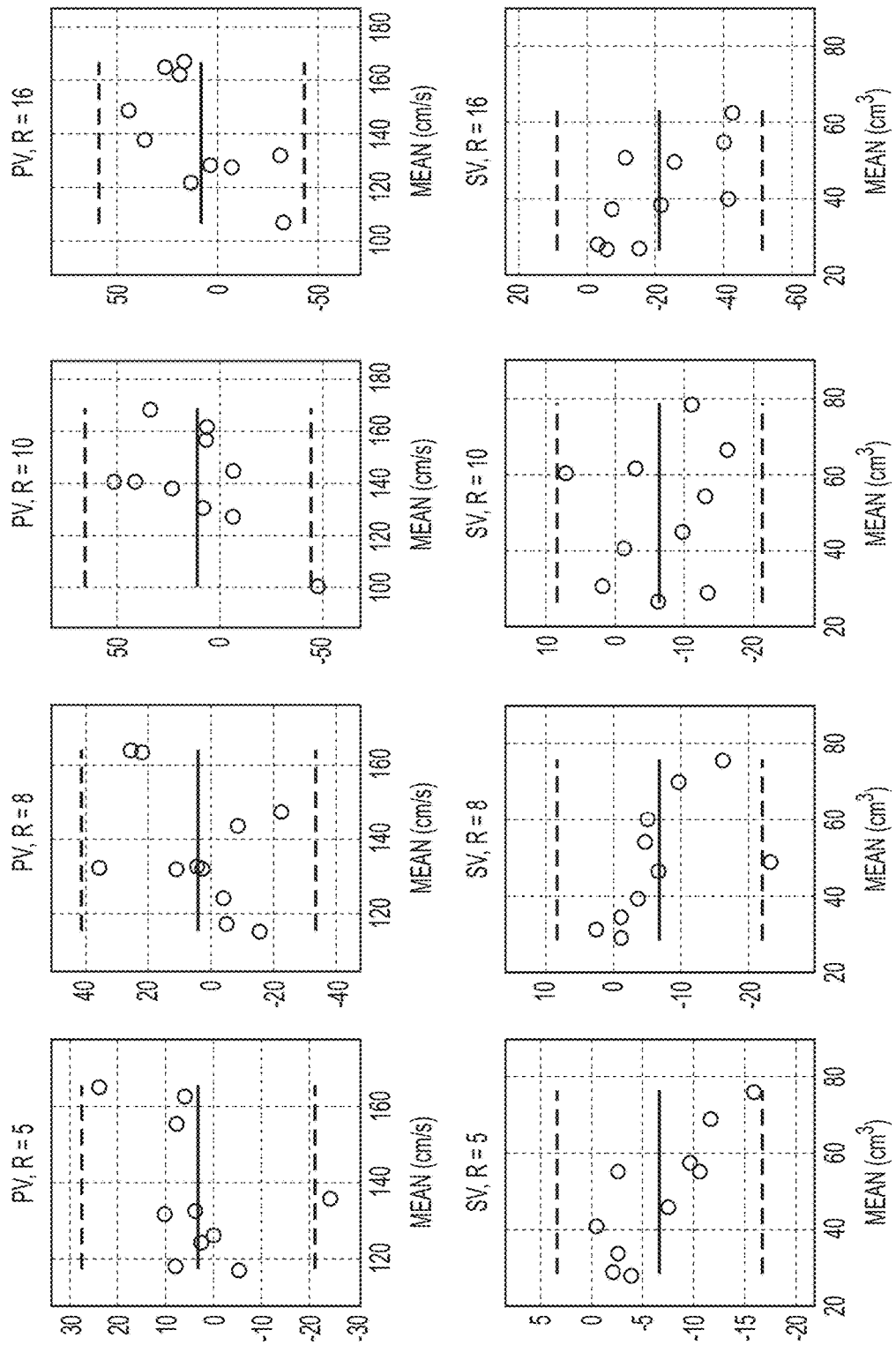

The corresponding Bland-Altman plots are provided in FIGS. 13-15. To quantify physiological changes in prospectively accelerated data, Bland-Altman analysis between two GRAPPA acquisitions was performed. The values for two GRAPPA acquisitions for SV are $\mu_d$=−1.28 mL, $\sigma_d$=2.59 mL, and r=0.99 and for PV $\mu_d$=0.66 cm/s, $\sigma_d$=9.72 cm/s, and r=0.81.

FIG. 13 illustrates Bland-Altman analyses for prospectively accelerated in vivo data reconstructed with ReVEAL. In the first column, the variation between two R=1.74 GRAPPA reconstructions is quantified. The remaining columns compare R=1.74 GRAPPA and ReVEAL at R=2,4,5, 8,10, and 16. Each column in the figure represents a different acceleration rate R. The top row contains results for peak velocity (PV); the bottom row contains results for stroke volume (SV). The solid line represents the mean difference, and dashed lines represent the 95% confidence intervals (mean±1.96×standard deviation).

FIG. 14 illustrates Bland-Altman analyses for prospectively accelerated in vivo data reconstructed with ReVEAL no mixture. In the first column, the variation between two R=1.74 GRAPPA reconstructions is quantified. The remaining columns compare R=1.74 GRAPPA and ReVEAL at R=2,4,5,8,10, and 16. Each column in the figure represents a different acceleration rate R. The top row contains results for peak velocity (PV); the bottom row contains results for stroke volume (SV). The solid line represents the mean difference, and dashed lines represent the 95% confidence intervals (mean±1.96×standard deviation).

FIG. 15 illustrates Bland-Altman analyses for prospectively accelerated in vivo data reconstructed with k-t SPARSE-SENSE. In the first column, the variation between two R=1.74 GRAPPA reconstructions is quantified. The remaining columns compare R=1.74 GRAPPA and ReVEAL at R=2,4,5,8,10, and 16. Each column in the figure represents a different acceleration rate R. The top row contains results for peak velocity (PV); the bottom row contains results for stroke volume (SV). The solid line represents the mean difference, and dashed lines represent the 95% confidence intervals (mean±1.96×standard deviation).

Figures 8A, 8B, 8C:
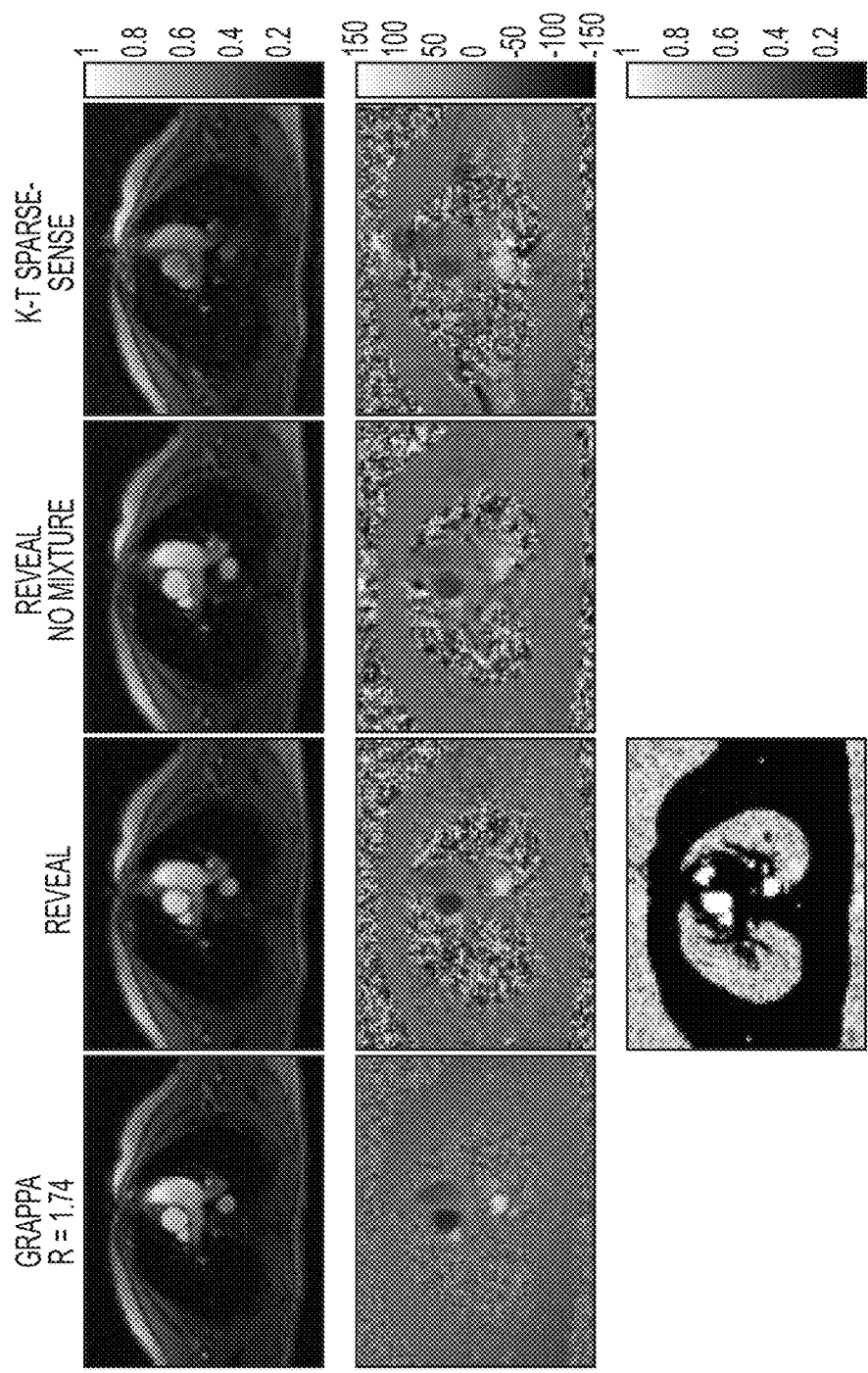
FIG. 8 illustrates prospectively accelerated in vivo data reconstructed at R=10 and GRAPPA at R=1.74.

As evident from Table 2, the variability of ReVEAL, for R≤10, compares favorably to both ReVEAL at R=2 and GRAPPA at R=1.74. As was the case for phantom imaging, fidelity of PV and SV is lost at R=16 as reflected in the relatively large bias and variance. In comparison, the performances of ReVEAL no mixture and k-t SPARSESENSE degrade rapidly beyond R=5. For R=10, representative velocity-time profiles for mean and peak velocities are shown in FIGS. 5C-5D. As evident from the figure, the profiles generated from ReVEAL closely follow the reference, while the profiles from ReVEAL no mixture show excessive bias, and the profiles from k-t SPARSE-SENSE show both excessive bias and variance. An example of images reconstructed at R=10 using the three methods is provided in FIG. 8, which shows prospectively accelerated in vivo data reconstructed at R=10 and GRAPPA at R=1.74. ReVEAL, ReVEAL no mixture, and k-t SPARSE-SENSE are compared for one representative frame. Row a shows the normalized magnitude image. Row b shows the velocity (phase) map in cm/s. Row c shows the posterior probability of velocity present in a voxel, in grayscale from 0 (black) to 1 (white). In FIG. 8, it is shown that only ReVEAL provides this time resolved posterior estimate of velocity locations. Row c in FIG. 8 further shows the posterior probability of the velocity indicator variable, v. This posterior probability map is an estimate produced by ReVEAL of the likely locations of velocity (shown in white) on a per pixel basis; it is a direct consequence of the mixture density model used in ReVEAL.

Discussion

The proposed ReVEAL approach for PC-MRI yields an empirical Bayes reconstruction with fast message passing computation that jointly processes the entire data set across space, time, coils, and encodings. Estimation of stroke volume and peak velocity using prospective in vivo acquisition at R=10 showed variance and Pearson correlation coefficient similar to R=1.74 $_{GRAPPA}$ (n=10); the accelerated measurement comprised four heart-beats in a single breath-hold, segmented acquisition. The posterior means computed by the algorithm provide MMSE estimates of image magnitude and velocity-encoded phase, and posterior variances provide, if desired and with no additional computation, confidence labels for the estimated quantities produced by the nonlinear reconstruction. Further, these posterior probabilities enable automated tuning of algorithm parameters via expectation-maximization, demonstrated here for selection of the prior probability of flow parameter, $\gamma$. The wavelet regularization in ReVEAL provides spatio-temporal regularization, while k-t SPARSE-SENSE, for example, captures only temporal regularization. Further, the signal structure present between encodings is exploited in ReVEAL using a non-Gaussian mixture density, which significantly reduced both bias and variance in SV and PV for R>5. The mixture density implicitly results in an automated segmentation of pixels via the posterior probability of the velocity indicator variable, v; the action of this velocity indicator, v, is particularly visible, for example, at the brachial arteries seen in FIG. 7.

The proposed Bayesian data model includes the independence assumption, $p(\theta_v|v)=p(\theta_v)$. This choice to impose no additional statistical dependence is adopted for computational convenience; that is, potential regularization gain from additional physically-motivated structure is conservatively bypassed in favor of computational simplicity. Yet, additional structure across space, time and encodings may indeed be incorporated in the Bayesian model presented here and is a topic of continuing investigation. Examples include Markov random fields and Markov trees. The Bayesian approach of ReVEAL enables both a flexible modeling framework and a fast computational engine for exploiting signal structure not readily captured in traditional regularized inversion methods.

The ReVEAL approach, as presented here, required one user-defined parameter, $\lambda_0$, that scaled the wavelet regularization; and, the ratios of regularization parameters for the eight wavelet subbands were set using a separate in vivo scan not otherwise included in the study. The automated expectation-maximization procedure used here for selection of the prior probability of flow, $\gamma$, could be employed for fully-automated tuning of all parameters.

The acceleration provided by ReVEAL may be traded for improved spatial or temporal resolution. For example, enhanced temporal resolution can allow flow imaging for pediatric and stress imaging applications where higher heart rates are encountered or for vessels, e.g. carotid or femoral arteries, with rapidly changing velocity-time profiles. Alternatively, the acceleration may enable real-time, free-breathing acquisition for 2D PC-MRI. Acceleration beyond the R=10 demonstrated here for through-plane flow imaging can be achieved in 4D flow imaging due to the added redundancy from the two additional encodings and one additional spatial dimension. The computational complexity of the approximate message passing algorithm scales only linearly in the number of encodings, receive coils, frames, and number of k-space samples per coil; therefore, ReVEAL is expected to remain computationally tractable for larger image series and for 4D flow imaging.

Example MRI Data Processing System

Figure 16:
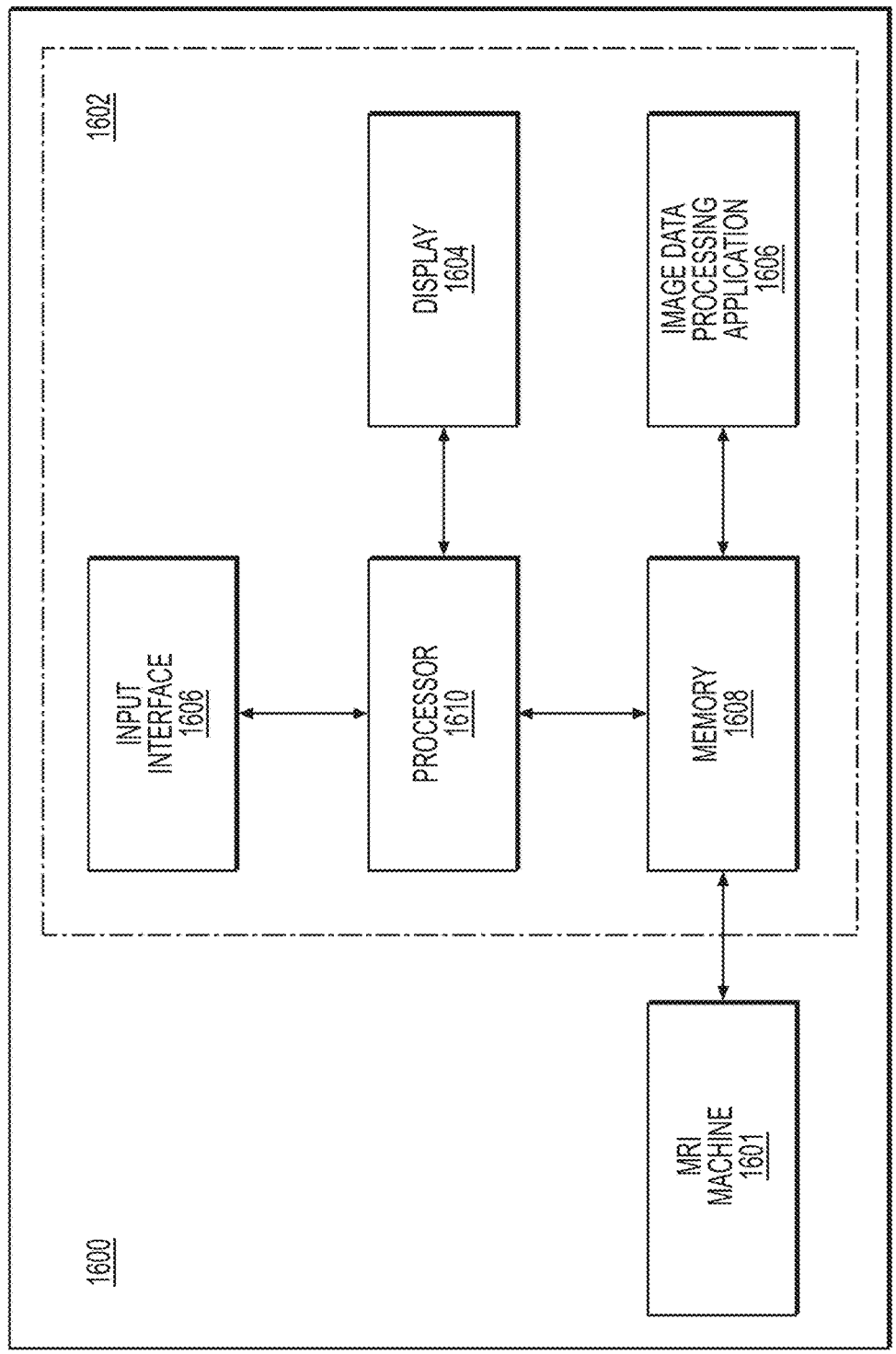
FIG. 16 illustrates a block diagram of an example MRI data processing system.

With reference to FIG. 16, there is illustrated a block diagram of an MRI data processing system 1600 is shown in accordance with an exemplary implementation. MRI data processing system 1600 may include a magnetic resonance imaging (MRI) apparatus 1601 and a computing device 1602. Computing device 1602 may include a display 1604, an input interface 1606, a memory 1608, a processor 1610, and an image data processing application 1612. In the embodiment illustrated in FIG. 16, MRI machine 1601 generates MRI image data.

Computing device 1602 may be a computer of any form factor. Different and additional components may be incorporated into computing device 1602. Components of MRI data processing system 1600 may be positioned in a single location, a single facility, and/or may be remote from one another. As a result, computing device 1602 may also include a communication interface, which provides an interface for receiving and transmitting data between devices using various protocols, transmission technologies, and media as known to those skilled in the art. The communication interface may support communication using various transmission media that may be wired or wireless.

Display 1604 presents information to a user of computing device 1602 as known to those skilled in the art. For example, display 1604 may be a thin film transistor display, a light emitting diode display, a liquid crystal display, or any of a variety of different displays known to those skilled in the art now or in the future.

Input interface 1606 provides an interface for receiving information from the user for entry into computing device 1602 as known to those skilled in the art. Input interface 1606 may use various input technologies including, but not limited to, a keyboard, a pen and touch screen, a mouse, a track ball, a touch screen, a keypad, one or more buttons, etc. to allow the user to enter information into computing device 1602 or to make selections presented in a user interface displayed on display 1604. Input interface 1606 may provide both an input and an output interface. For example, a touch screen both allows user input and presents output to the user.

Memory 1608 is an electronic holding place or storage for information so that the information can be accessed by processor 1610 as known to those skilled in the art. Computing device 1602 may have one or more memories that use the same or a different memory technology. Memory technologies include, but are not limited to, any type of RAM, any type of ROM, any type of flash memory, etc. Computing device 1602 also may have one or more drives that support the loading of a memory media such as a compact disk or digital video disk.

Processor 1610 executes instructions as known to those skilled in the art. The instructions may be carried out by a special purpose computer, logic circuits, or hardware circuits. Thus, processor 1610 may be implemented in hardware, firmware, software, or any combination of these methods. The term "execution" is the process of running an application or the carrying out of the operation called for by an instruction. The instructions may be written using one or more programming language, scripting language, assembly language, etc. Processor 1610 executes an instruction, meaning that it performs the operations called for by that instruction. Processor 1610 operably couples with display 1604, with input interface 1606, with memory 1608, and with the communication interface to receive, to send, and to process information. Processor 1610 may retrieve a set of instructions from a permanent memory device and copy the instructions in an executable form to a temporary memory device that is generally some form of RAM. Computing device 1602 may include a plurality of processors that use the same or a different processing technology.

Image data processing application 1612 performs operations associated with performing parallel image reconstruction of undersampled image data in k-space. Some or all of the operations subsequently described may be embodied in image data processing application 1612. The operations may be implemented using hardware, firmware, software, or any combination of these methods. With reference to the exemplary embodiment of FIG. 16, image data processing application 1612 is implemented in software stored in memory 1608 and accessible by processor 1610 for execution of the instructions that embody the operations of image data processing application 1612. Image data processing application 1612 may be written using one or more programming languages, assembly languages, scripting languages, etc.

MRI machine 1601 and computing device 1602 may be integrated into a single system such as an MRI machine. MRI machine 1601 and computing device 1602 may be connected directly. For example, MRI machine 1601 may connect to computing device 1602 using a cable for transmitting information between MRI machine 1601 and computing device 1602. MRI machine 1601 may connect to computing device 1602 using a network. MRI images may be stored electronically and accessed using computing device 1602. MRI machine 1601 and computing device 1602 may not be connected. Instead, the MRI data acquired using MRI machine 1601 may be manually provided to computing device 1602. For example, the MRI data may be stored on electronic media such as a CD or a DVD. After receiving the MRI data, computing device 1602 may initiate processing of the set of images that comprise an MRI study.

CONCLUSION

Thus, the present disclosure presented ReVEAL as a novel technique for recovery of accelerated PC-MRI data; the approach includes Bayesian modeling of PC-MRI data, a VISTA sampling strategy, and fast message passing computation. Quantitative results were presented for in vivo and flow phantom data for 2D through plane flow measurements; further, ReVEAL is extensible to applications such as 4D flow, real-time 2D flow, and DENSE.

What is claimed:
1. A method of image acquisition and reconstruction in a magnetic resonance imaging (MRI) apparatus, comprising:
acquiring, during a single breath-hold, undersampled phase-contrast magnetic resonance imaging (PC-MRI) data associated with physiological activity in an area of interest of a subject using Variable density incoherent spatiotemporal acquisition (VISTA) sampling;
determining conditional distributions for velocity-encoded measurements in the PC-MRI data for a velocity-free region and a velocity-containing region;
performing a Bayesian modeling of the PC-MRI data and conditional distributions to determine a posterior distribution;
determining a mean squared error (MMSE) estimate of image magnitude and velocity-encoded phase from the posterior distribution;
performing parallel image reconstruction from the estimate of image magnitude and velocity-encoded phase; and
displaying the reconstructed images corresponding to the physiological activity in the area of interest.

2. The method of claim 1, wherein the Bayesian modeling is visualized as a factor graph.

3. The method of claim 2, further comprising applying a sum-product rule using approximate message passing on the factor graph.

4. The method of claim 3, further comprising determining approximate marginal posterior distributions of $x_b$, $x_v$, $\theta_v$, and v,
wherein $x_b$ represents an image associated with a velocity-compensated measurement, wherein $x_v$ represents an image associated with a velocity-encoded measurement, where $\theta_v$ represents a velocity-encoded phase, and wherein v represents a Bernoulli random variable.

5. The method of claim 1, wherein the Bayesian modeling provides for automatic tuning of at least one parameter associated with the image reconstruction.

6. The method of claim 5, wherein the at least one parameter includes a prior probability of flow at each pixel and frame, and a variability between encodings.

7. The method of claim 1, wherein PC-MRI data is downsampled to obtain acceleration factors R=1, 2, 4, 6, 8, 10 12, 14 and 16.

8. A magnetic resonance imaging (MRI) system, comprising:
an MRI machine that acquires, during a single breath-hold, undersampled phase-contrast magnetic resonance imaging (PC-MRI) data associated with physiological activity in an area of interest of a subject using Variable density incoherent spatiotemporal acquisition (VISTA) sampling and generates MRI image data;
a computing device that receives the PC-MRI data, determines conditional distributions for velocity-encoded measurements in the PC-MRI data for a velocity-free region and a velocity-containing region, performs a Bayesian modeling of the PC-MRI data and conditional distributions to determine a posterior distribution, determines a mean squared error (MMSE) estimate of image magnitude and velocity-encoded phase from the posterior distribution, and performs parallel image reconstruction from the estimate of image magnitude and velocity-encoded phase; and
a display that receives and displays the reconstructed images corresponding to the physiological activity in the area of interest.

9. The system of claim 8, wherein the Bayesian modeling is visualized as a factor graph.

10. The system of claim 9, wherein the computing device further applies a sum-product rule using approximate message passing on the factor graph.

11. The system of claim 10, wherein the computing device further determines approximate marginal posterior distributions of $x_b$, $x_v$, $\theta_v$, and v,
wherein $x_b$ represents an image associated with a velocity-compensated measurement, wherein $x_v$ represents an image associated with a velocity-encoded measurement, where $\theta_v$ represents a velocity-encoded phase, and wherein v represents a Bernoulli random variable.

12. The system of claim 8, wherein the Bayesian modeling provides for automatic tuning of at least one parameter associated with the image reconstruction.

13. The system of claim 12, wherein the at least one parameter includes a prior probability of flow at each pixel and frame, and a variability between encodings.

14. The system of claim 8, wherein PC-MRI data is downsampled to obtain acceleration factors R=1, 2, 4, 6, 8, 10 12, 14 and 16.

15. A non-transitory computer readable medium containing computer executable instructions that when executed by a processor of a computing device causes the computing device to perform a method of image acquisition and reconstruction in a magnetic resonance imaging (MRI) apparatus, comprising:
 acquiring, during a single breath-hold, undersampled phase-contrast magnetic resonance imaging (PC-MRI) data associated with physiological activity in an area of interest of a subject using Variable density incoherent spatiotemporal acquisition (VISTA) sampling;
 determining conditional distributions for velocity-encoded measurements in the PC-MRI data for a velocity-free region and a velocity-containing region;
 performing a Bayesian modeling of the PC-MRI data and conditional distributions to determine a posterior distribution;
 determining a mean squared error (MMSE) estimate of image magnitude and velocity-encoded phase from the posterior distribution;
 performing parallel image reconstruction from the estimate of image magnitude and velocity-encoded phase; and
 displaying the reconstructed images corresponding to the physiological activity in the area of interest.

16. The non-transitory computer readable medium of claim 15, wherein the Bayesian modeling is visualized as a factor graph.

17. The non-transitory computer readable medium of claim 16, further comprising instructions for applying a sum-product rule using approximate message passing on the factor graph.

18. The non-transitory computer readable medium of claim 17, further comprising instructions for determining approximate marginal posterior distributions of $X_b$, $X_v$, $\theta_v$, and v,
 wherein $x_b$ represents an image associated with a velocity-compensated measurement, wherein $x_v$ represents an image associated with a velocity-encoded measurement, where $\theta_v$ represents a velocity-encoded phase, and wherein v represents a Bernoulli random variable.

19. The non-transitory computer readable medium of claim 15, wherein the Bayesian modeling provides for automatic tuning of at least one parameter associated with the image reconstruction.

20. The non-transitory computer readable medium of claim 15, wherein PC-MRI data is downsampled to obtain acceleration factors R=1, 2, 4, 6, 8, 10 12, 14 and 16.

* * * * *

UNITED STATES PATENT AND TRADEMARK OFFICE
CERTIFICATE OF CORRECTION

Page 1 of 1

PATENT NO. : 10,534,059 B2
APPLICATION NO. : 15/160083
DATED : January 14, 2020
INVENTOR(S) : Adam Rich et al.

It is certified that error appears in the above-identified patent and that said Letters Patent is hereby corrected as shown below:

In the Specification

Column 1, Lines 15-19 replace the Government Support Clause with:
--This invention was made with government support under grant number HL102450 awarded by the National Institutes of Health. The government has certain rights in the invention.--

Signed and Sealed this
Thirteenth Day of October, 2020

Andrei Iancu
*Director of the United States Patent and Trademark Office*